US010198372B2

(12) United States Patent
Moon

(10) Patent No.: US 10,198,372 B2
(45) Date of Patent: Feb. 5, 2019

(54) ELECTRONIC DEVICE AND METHOD FOR FABRICATING THE SAME

(71) Applicant: SK hynix Inc., Icheon-Si (KR)

(72) Inventor: Joo-Young Moon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/481,308

(22) Filed: Apr. 6, 2017

(65) Prior Publication Data
US 2018/0040809 A1 Feb. 8, 2018

(30) Foreign Application Priority Data

Aug. 8, 2016 (KR) .................. 10-2016-0100846

(51) Int. Cl.
G11C 11/00 (2006.01)
G06F 13/16 (2006.01)
H01L 43/12 (2006.01)
H01L 43/08 (2006.01)
H01L 27/22 (2006.01)
G11C 11/16 (2006.01)
G06F 12/0875 (2016.01)

(52) U.S. Cl.
CPC ...... *G06F 13/1673* (2013.01); *G06F 12/0875* (2013.01); *G11C 11/161* (2013.01); *G11C 11/1675* (2013.01); *H01L 27/222* (2013.01); *H01L 43/08* (2013.01); *H01L 43/12* (2013.01); *G06F 2212/452* (2013.01)

(58) Field of Classification Search
CPC ..... H01L 43/02; H01L 45/124; H01L 27/222; H01L 43/08; G06F 12/0875; G11C 11/1675
See application file for complete search history.

(56) References Cited

U.S. PATENT DOCUMENTS

2015/0129998 A1  5/2015 Mani
2017/0040531 A1* 2/2017 Chung .................. H01L 43/12
2017/0062031 A1* 3/2017 Han .................... H01L 27/228
2017/0110650 A1* 4/2017 Park .................... H01L 43/02

* cited by examiner

*Primary Examiner* — Mohammed A Bashar
(74) *Attorney, Agent, or Firm* — Perkins Coie LLP

(57) ABSTRACT

This technology provides an electronic device and a method for fabricating the same. An electronic device in accordance with an implementation of this document may include a semiconductor memory, wherein the semiconductor memory may include: one or more variable resistance elements each exhibiting different resistance states for storing data, wherein each variable resistance element may include: a Magnetic Tunnel Junction (MTJ) structure including a free layer having a changeable magnetization direction, a pinned layer having a fixed magnetization direction and a tunnel barrier layer interposed between the free layer and the pinned layer; a seed layer disposed under the MTJ structure to facilitate a growth of the pinned layer or the free layer; and an amorphous metallic carbon layer disposed under the seed layer.

19 Claims, 14 Drawing Sheets

ELECTRONIC DEVICE AND METHOD FOR FABRICATING THE SAME

CROSS-REFERENCE TO RELATED APPLICATIONS

This patent document claims priority of Korean Patent Application No. 10-2016-0100846, entitled "ELECTRONIC DEVICE AND METHOD FOR FABRICATING THE SAME" and filed on Aug. 8, 2016, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device and a method for fabricating the same, in which an electronic device includes a semiconductor memory which can improve characteristics of a variable resistance element.

In an implementation, an electronic device may include a semiconductor memory, wherein the semiconductor memory may include: one or more variable resistance elements each exhibiting different resistance states for storing data, wherein each variable resistance element may include: a Magnetic Tunnel Junction (MTJ) structure including a free layer having a changeable magnetization direction, a pinned layer having a fixed magnetization direction and a tunnel barrier layer interposed between the free layer and the pinned layer; a seed layer disposed under the MTJ structure to facilitate a growth of the pinned layer or the free layer; and an amorphous metallic carbon layer disposed under the seed layer.

Implementations of the above device may include one or more the following.

The semiconductor memory may further include a first spacer disposed on at least a portion of sidewalls of the variable resistance element and containing carbon. The first spacer may further include a metal or metal oxide with a smaller amount than the carbon. The semiconductor memory may further include a second spacer disposed between the first spacer and the variable resistance element and including a metal or metal oxide. The semiconductor memory may further include a third spacer disposed between the first spacer and the second spacer and including silicon oxide, silicon nitride or a combination thereof. The semiconductor memory may further include a second spacer disposed over the first spacer and including a metal or metal oxide. The semiconductor memory may further include a third spacer disposed between the first spacer and the second spacer and including silicon oxide, silicon nitride or a combination thereof. The metallic carbon layer may be disposed in a lowermost portion of the variable resistance element. The metallic carbon layer may include an upper portion having sidewalls which are aligned with the seed layer and the MTJ structure, and a lower portion having a width which is wider than that of the upper portion and having sidewalls which are not aligned with the upper portion. The variable resistance element may further include a buffer layer interposed between the seed layer and the metallic carbon layer. The buffer layer may include an upper portion having sidewalls which are aligned with the seed layer and the MTJ structure, and a lower portion having a width which is wider than that of the upper portion and having sidewalls which are not aligned with the upper portion, and the metallic carbon layer may include an upper portion having sidewalls which are aligned with the lower portion of the buffer layer and a lower portion having a width which is wider than that of the upper portion of the metallic carbon layer and having sidewalls which are not aligned with the upper portion of the metallic carbon layer. The variable resistance element may further include a lower electrode disposed in a lowermost portion of the variable resistance element, and the metallic carbon layer may be disposed between the seed layer and the lower electrode. The lower electrode may include an upper portion having sidewalls which are aligned with the metallic carbon layer, the seed layer and the MTJ structure, and a lower portion having a width which is wider than that of the upper portion and having sidewalls which are not aligned with the upper portion. The metallic carbon layer may include an upper portion having sidewalls which are aligned with the seed layer and the MTJ structure, and a lower portion having a width which is wider than that of the upper portion and having sidewalls which are not aligned with the upper portion, and the lower electrode may include an upper portion having sidewalls which are aligned with the lower portion of the metallic carbon layer, and a lower portion having a width which is wider than that of the upper portion of the lower electrode and having sidewalls which are not aligned with the upper portion of the lower electrode. The semiconductor memory may further include a spacer disposed on at least a portion of sidewalls of a remaining part of the variable resistance element other than the lower electrode, wherein the spacer and the remaining part of the variable resistance element may cover the lower electrode.

In another implementation, an electronic device may include a semiconductor memory, wherein the semiconductor memory may include: a substrate including a switching element formed in the substrate; a contact plug formed over the substrate and coupled to the switching element; and a variable resistance element exhibiting different resistance states for storing data, formed over the contact plug and including an amorphous metallic carbon layer, a magnetic tunneling junction (MTJ) structure formed over the amorphous metallic carbon layer, and a spacer formed on a sidewall of the MTJ structure and including carbon as a most significant component of the spacer.

Implementations of the above device may include one or more the following.

The carbon has a percentage greater than that of a metal in the spacer. The amorphous metallic carbon layer is conductive. The electronic device further compress a metal-containing layer formed between the amorphous metallic carbon layer and the MTJ structure. The MTJ structure includes a free layer having a changeable magnetization direction, a pinned layer having a fixed magnetization direction and a tunnel barrier layer interposed between the free layer and the pinned layer. The amorphous metallic carbon layer has an upper portion and a lower portion, the upper portion having a smaller width than that of the lower portion. The spacer further extends to cover at least a portion of a sidewall of the amorphous metallic carbon layer. The spacer has an insulating property.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another implementation, a method for fabricating an electronic device including a semiconductor memory may include forming an amorphous metallic carbon layer over a substrate; forming a seed layer over the metallic carbon layer; forming, over the seed layer, a Magnetic Tunnel Junction (MTJ) structure including a free layer having a changeable magnetization direction, a pinned layer having a fixed magnetization direction and a tunnel barrier layer interposed between the free layer and the pinned layer; forming an MTJ structure pattern and a seed layer pattern by selectively etching the MTJ structure and the seed layer to expose a portion of the metallic carbon layer; and etching the exposed portion of the metallic carbon layer.

Implementations of the above method may include one or more the following.

The etching of the exposed portion of the metallic carbon layer includes forming a first spacer on sidewalls of the MTJ structure pattern and the seed layer pattern and including carbon. The first spacer further comprises a metal or metal oxide with a smaller amount than the carbon. The method may further include performing an oxidation process on the first spacer after the etching of the exposed portion of the metallic carbon layer. The method may further include forming a buffer layer between the metallic carbon layer and the seed layer, and forming a buffer layer pattern by etching the buffer layer after the forming the MTJ structure pattern and the seed layer pattern, wherein, the etching of the exposed portion of the metallic carbon layer includes etching at least a portion of the metallic carbon layer which is exposed by the buffer layer pattern as well as the MTJ structure pattern and the seed layer pattern. The forming of the buffer layer pattern may include performing a first etching on a portion of the buffer layer; forming a second spacer on sidewalls of a portion of the etched buffer layer, the MTJ structure pattern and the seed layer pattern; and performing a second etching on a remaining portion of the buffer layer which is exposed by the second spacer. The etching of the exposed portion of the metallic carbon layer includes forming a first spacer on the second spacer and including carbon. The forming the second spacer may include forming a metal oxide spacer which comes in contact with sidewalls of at least a portion of the variable resistance element; and forming an insulating spacer including silicon oxide, silicon nitride or a combination thereof on outer sidewalls of the metal oxide spacer. The method may further include forming a lower electrode layer under the metallic carbon layer. The method may further include etching a portion of the lower electrode layer which is exposed by the etching of the exposed portion of the metallic carbon layer. The method may further include performing an oxidation process after the etching of the portion of the lower electrode layer. The etching of the exposed portion of the metallic carbon layer may include performing a first etching on a portion of the exposed portion of the metallic carbon layer; forming a first spacer on sidewalls of the portion of the exposed portion of the metallic carbon layer, the MTJ structure pattern and the seed layer pattern; and performing a second etching on a remaining portion of the exposed portion of the metallic carbon layer which is exposed by the first spacer. The etching of the portion of the lower electrode layer includes forming a second spacer on the first spacer to include a metal. The forming the first spacer may include forming a carbon-containing spacer which comes in contact with at least a portion of a stacked structure including the amorphous metallic carbon layer, the seed layer, the MTJ structure; and forming an insulating spacer including silicon oxide, silicon nitride or a combination thereof on outer sidewalls of the carbon-containing spacer. The method may further include a spacer with a thickness that sufficiently covers the lower electrode layer on sidewalls of the etched metallic carbon layer, the MTJ structure pattern and the seed layer pattern, after etching at least the portion of the lower electrode layer.

These and other aspects, implementations and associated advantages are described in greater detail in the drawings, the description and the claims.

DETAILED DESCRIPTION

Figure 1A:
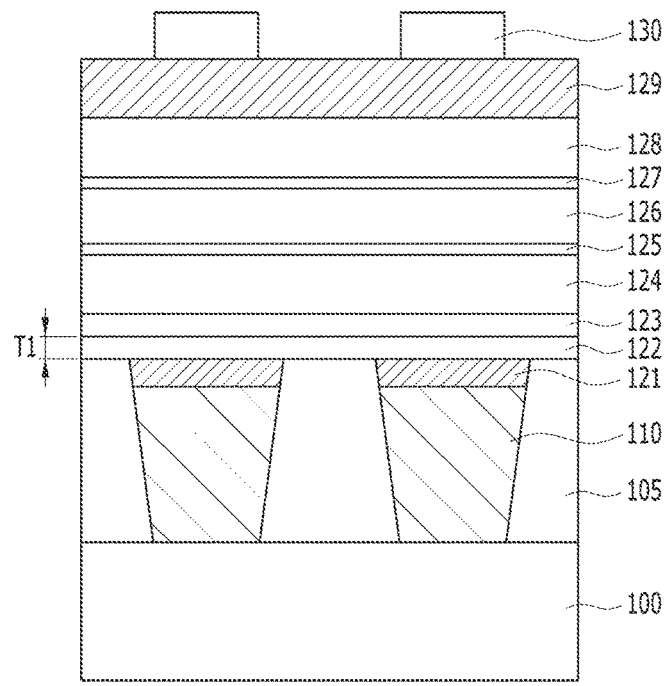
FIGS. 1A and 1B are cross-sectional views describing a semiconductor memory and a method for fabricating a semiconductor memory in accordance with a comparative example.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Prior to describing an implementation, a comparative example and a drawback thereof will be described to be compared with the implementation.

Figure 1B:
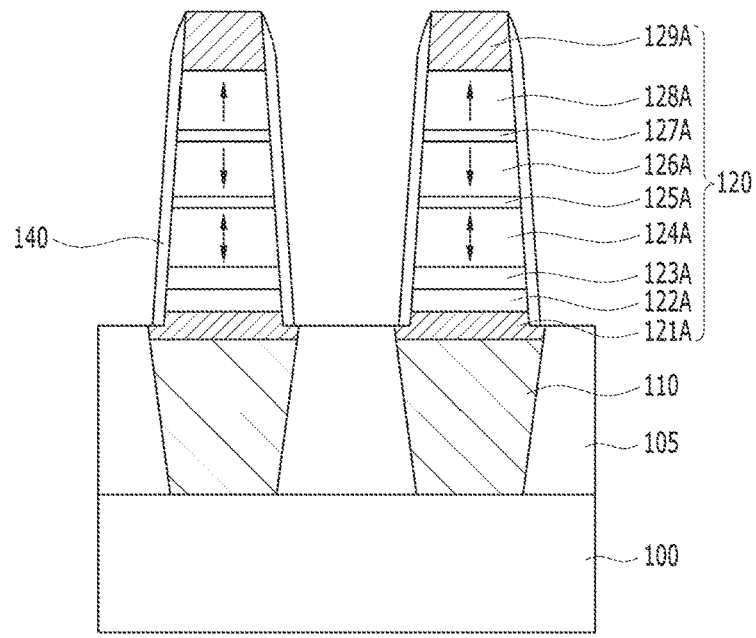

FIGS. 1A and 1B are cross-sectional views describing a semiconductor memory and a method for fabricating a semiconductor memory in accordance with a comparative example. Specifically, variable resistance elements 120 are formed over a substrate 100 and are structured to exhibit different resistance states of different resistance values for representing different digital states in data storage. The resistance state of a variable resistance element 120 can be changed in a data writing operation to write new data.

Referring to FIG. 1A, an interlayer dielectric layer 105 may be formed over a substrate 100.

Subsequently, a hole exposing a portion of the substrate 100 may be formed by selectively etching the interlayer dielectric layer 105 and then a lower contact plug 110 filling the power portions of the hole may be formed.

Subsequently, a lower electrode layer 121 of a variable resistance element filling a remaining portion of the hole may be formed over the lower contact plug 110. The lower electrode layer 121 may be a part of the variable resistance element and distinguished from the lower contact plug 110 that is coupled to a lower end of the variable resistance element in order to couple the variable resistance element to another device. The lower electrode layer 121 fills the hole to reduce a height of an etch target during an etch process for fabricating the variable resistance element and make it easy to perform the etch process. The lower electrode layer 121 may be formed by forming a conductive material in a thickness that sufficiently fills the holes in which the lower contact plug 110 is formed and then performing a planarization process such as a Chemical Mechanical Polishing (CMP) process until an upper surface of the interlayer dielectric layer 105 is exposed. As a result, the lower electrode layer 121 may have a planarized upper surface. Moreover, the lower electrode layer 121 and the lower contact plug 110 may have sidewalls that are aligned with each other.

Subsequently, material layers 122 to 129 for forming a remaining part of the variable resistance element other than the lower electrode layer 121 may be formed over the interlayer dielectric layer 105 and the lower electrode layer 121. In this comparative example, the material layers 122 to 129 may include a buffer layer 122, a seed layer 123, a free layer 124, a tunnel barrier layer 125, a pinned layer 126, an exchange coupling layer 127, a magnetic correction layer 128 and a capping layer 129 which are subsequently stacked. The free layer 124 having a changeable magnetization direction, the pinned layer 126 having a fixed magnetization direction and the tunnel barrier layer 125 interposed between the free layer 124 and the pinned layer 126 and allowing the tunneling of electrons during a data write operation that changes the resistance state of the variable resistance element may form a Magnetic Tunnel Junction (MTJ) structure. The seed layer 123 may be disposed under the free layer 124 and help the free layer 124 to grow to have a desired crystalline structure and/or lattice structure. The buffer layer 122 may be interposed between the lower electrode layer 121 and the seed layer 123 to prevent the lower electrode layer 121 from exerting an influence on the crystallinity of the seed layer 123. For this purpose, a thickness T1 of the buffer layer 122 may be equal to or more than a predetermined value. The magnetic correction layer 128 may be placed over the pinned layer 126 and have a magnetization direction opposite to that of the pinned layer 126 to offset or reduce an influence of a stray field generated by the pinned layer 126. The exchange coupling layer 127 may be interposed between the pinned layer 126 and the magnetic correction layer 128 and provide an exchange coupling therebetween. The capping layer 129 may be placed in an uppermost portion of the variable resistance element and function as both an upper electrode of the variable resistance element and a hard mask for pattering the variable resistance element which is to be described below.

Subsequently, a mask pattern 130 for patterning the variable resistance element may be formed over the capping layer 129. The mask pattern 130 may overlap with the lower electrode layer 121 and have a width narrower than that of the lower electrode layer 121. Specifically, a width of the mask pattern 130 may be controlled so that although a width of a stacked structure (see, 122A to 129A of FIG. 1B) is increased downwardly, a width of a lower surface of the stacked structure 122A to 129A is narrower than a width of a upper surface of the lower electrode 121. This feature can ensure that the layers included in the variable resistance element are to be formed over a planarized surface in order to secure desired characteristics of the variable resistance element. For example, if a width of the lower surface of the stacked structure 122A to 129A is greater than that of the upper surface of the lower electrode layer 121, a tunnel barrier layer pattern (see, 125A of FIG. 1B), is positioned on an interface between the lower electrode layer 121 and the interlayer dielectric layer 105. In this case, height differences may exist around the interface between the lower electrode layer 121 and the interlayer dielectric layer 105, and, due to such height differences, the tunnel barrier layer pattern 125A may be located over a non-planarized surface. Accordingly, the tunnel barrier layer pattern 125A may be bent, and thus characteristics of the variable resistance element may be deteriorated due to Neel Coupling effect. Accordingly, in order to avoid this problem, it is desirable that the lower surface of the stacked structure 122A to 129A overlaps with the upper surface of the lower electrode layer 121 and have a width narrower than that of the upper surface of the lower electrode layer 121 so that the whole lower surface of the stacked structure 122A to 129A comes in contact with the planarized surface of the lower electrode layer 121.

Referring to FIG. 1B, the capping layer 129, the magnetic correction layer 128, the exchange coupling layer 127, the pinned layer 126, the tunnel barrier layer 125, the free layer 124, the seed layer 123 and the buffer layer 122 may be etched using the mask pattern 130 as an etch barrier so as to form a stacked structure 122A to 129A where a buffer layer pattern 122A, a seed layer pattern 123A, a free layer pattern 124A, a tunnel barrier layer pattern 125A, a pinned layer pattern 126A, an exchange coupling layer pattern 127A, a magnetic correction layer pattern 128A and a capping layer pattern 129A are piled up. When a width of a lower surface of the stacked structure 122A to 129A is narrower than that of an upper surface of the lower electrode layer 121, a portion of the lower electrode layer 121 may be exposed by forming the stacked structure 122A to 129A.

In this case, an over etch process may be performed to separate the adjacent stacked structures 122A to 129A from each other, and as a result, the exposed portion of the lower electrode layer 121 and the interlayer dielectric layer 105 may be etched. The lower electrode layer 121 in which a portion is etched may be referred to as a lower electrode 121A. As such, a variable resistance element 120 in which the lower electrode 121A, the buffer layer pattern 122A, the seed layer pattern 123A, the free layer pattern 124A, the tunnel barrier layer pattern 125A, the pinned layer pattern 126A, the exchange coupling layer pattern 127A, the magnetic correction layer pattern 128A and the capping layer pattern 129A are stacked may be formed. A lower portion of the lower electrode 121A may be buried in the interlayer dielectric layer 105 and an upper portion of the lower electrode 121A may protrude from the interlayer dielectric layer 105. The mask pattern 130 may be removed during this etch process or by a separate removal process.

Meanwhile, during the etch process for forming the variable resistance element 120, etch byproducts derived from the objects, i.e., layers, to be etched may be redeposited on a surface to be etched. As a result, a spacer 140 due to such etch byproducts may be formed on sidewalls of the variable resistance element 120 after patterning the variable resistance element 120. The spacer 140 may include etch byproducts derived from various layers included in the variable resistance element 120. Among various layers of the variable resistance element 120, the layer disposed in a lower portion of the variable resistance element 120 more involves with the formation of the spacer 140 as compared to the layer disposed in an upper portion of the variable resistance element. The layer disposed in a lower portion of the variable resistance element 120 is etched relatively late as compared to the layer in an upper portion of the variable resistance element 120, the etch byproducts derived from the layer disposed in a lower portion may be largely contained in the spacer 140, while the etch byproducts derived from the layer disposed on an upper portion of the variable resistance element 120 and being etched relatively early may be less or rarely contained in the spacer 140. This is because although the etch byproducts from the layer etched relatively earlier are redeposited during the subsequent etch process, the redeposited etch byproducts are mostly removed again as the etch process proceeds. This will be exemplarily explained with reference to FIG. 1C.

Figure 1C:
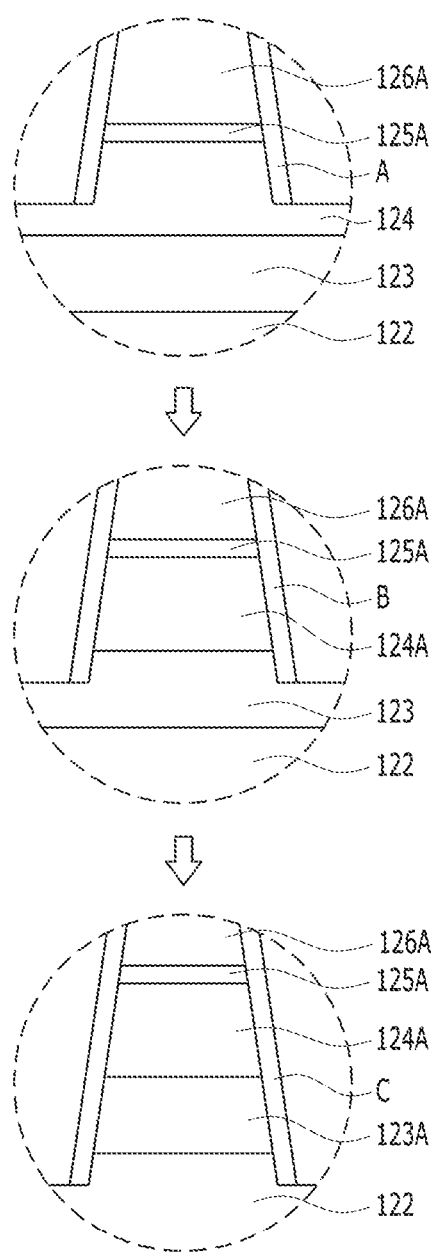
FIG. 1C is a cross-sectional view describing an etch process for forming a variable resistance element shown in FIG. 1B.

FIG. 1C is a cross-sectional view describing the etch process for forming the variable resistance element shown in FIG. 1B.

Referring to FIG. 1C, an etch process is performed on the free layer 124. During the etching process on the free layer 124, first etch byproducts A are attached to an etched surface and may include a material which is mainly included in the free layer 124. This is because the etch byproducts attached previously and including a material of other layers previously etched are removed during the etch process on the free layer 124.

The etching of the free layer 120 is completed and the free layer pattern 124A is formed. Then, an etch process is performed on the seed layer 123 that is disposed under the free layer pattern 124A. Similarly, during the etch process of the seed layer 123, most of the first etch byproducts A that were previously attached during the etching of the free layer 120 are removed and second etch byproducts B derived from the seed layer 123 are attached to a surface to be etched.

The etching of the seed layer 123 is completed and the seed layer pattern 123A is formed. Then, an etch process is performed on the buffer layer 122 that is disposed under the seed layer pattern 123A. Similarly, during the etching of the buffer layer 122, most of the second etch byproducts B that were previously attached during the etching of the seed layer 123 are removed, and third etch byproducts C derived from the buffer layer 122 are attached to a surface to be etched.

In this manner, the etch byproducts from etching the layers in the later stage of the etching process may be a main component of the spacer. Occasionally, although the etch byproducts produced from etching the layer sin the beginning stage of the etching process may be present in the spacer, the amount of such byproducts may be relatively very low when comparing to the amount of the etch byproducts from etching the layers in the later stage of the etching process.

Referring back to FIG. 1B, as a result, the spacer 140 on the sidewalls of the variable resistance element 120 may mainly include materials included in the buffer layer pattern 122A and the lower electrode 121A that are etched relative late compared to other layers 123A to 129A. Since the lower electrode layer 121 which is etched finally among the stacked structures 122A to 129A is etched by over etching, the etch byproducts derived from the buffer layer 122 may not be sufficiently removed during the etch process on the lower electrode layer 121. Thus, the spacer 140 includes the substantial amounts of the materials of the buffer layer pattern 122A as well as the lower electrode 121A. The buffer layer pattern 122A and the lower electrode 121A may be formed of or include metal-containing material such as a metal, metal nitride, or others. Accordingly, the spacer 140 includes a metal, and thus there is a problem of occurring current leakage through the spacer 140. For example, the free layer pattern 124A and the pinned layer pattern 126A need to be electrically insulated from each other but may be electrically coupled to each other through the spacer 140.

In order to prevent the electrical coupling between the free layer pattern 124A and the pinned layer pattern 126A through the spacer 140, after forming the variable resistance element 120, an oxidation process may be performed so as to change the spacer 140 into an insulating material. That is, the spacer 140 may be changed so as to include an insulating metal oxide by the oxidation process. However, in this case, not only the spacer 140 but also a portion of the layers included in the variable resistance element 120 may be oxidized so that characteristics of the variable resistance element 120 may be deteriorated. For example, when both sidewalls of the magnetic correction layer pattern 128A are oxidized, a width of the actual part which substantially functions as the magnetic correction layer may be reduced and the magnetic correction function may not be sufficiently performed. As a result, operation characteristics of the variable resistance element 120 may be deteriorated. However, if the oxidation process is omitted or is performed with less strength to avoid the problem, the spacer 140 may not be sufficiently oxidized, which results in the occurrence of current leakage.

In accordance with an implementation of the present disclosure, a semiconductor memory and its fabricating method are provided to secure characteristics of the variable resistance element and simultaneously overcome the above-mentioned problems on the oxidation, for example, a trade-off between the current leakage and the deterioration of the operation characteristics.

Figure 2A:
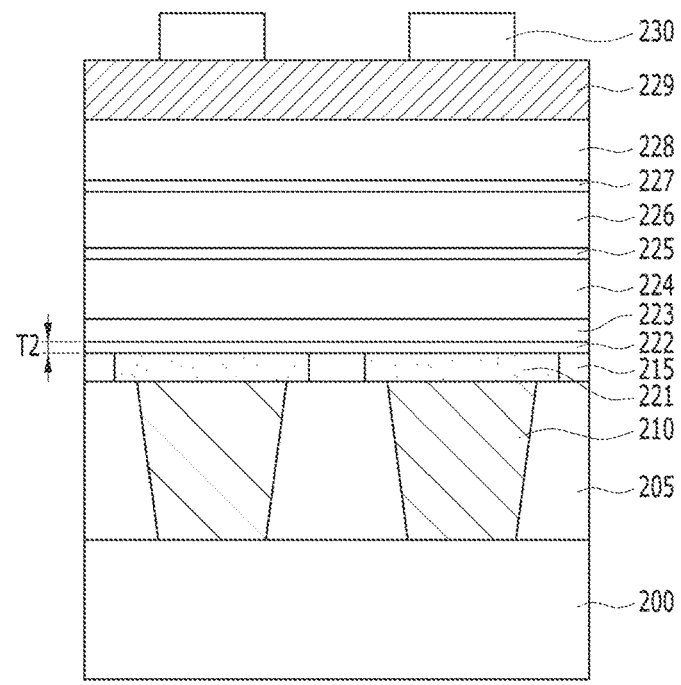
FIGS. 2A to 2C are cross-sectional views describing a semiconductor memory and a method for fabricating the semiconductor memory in accordance with one implementation of the present disclosure.
Figure 2B:
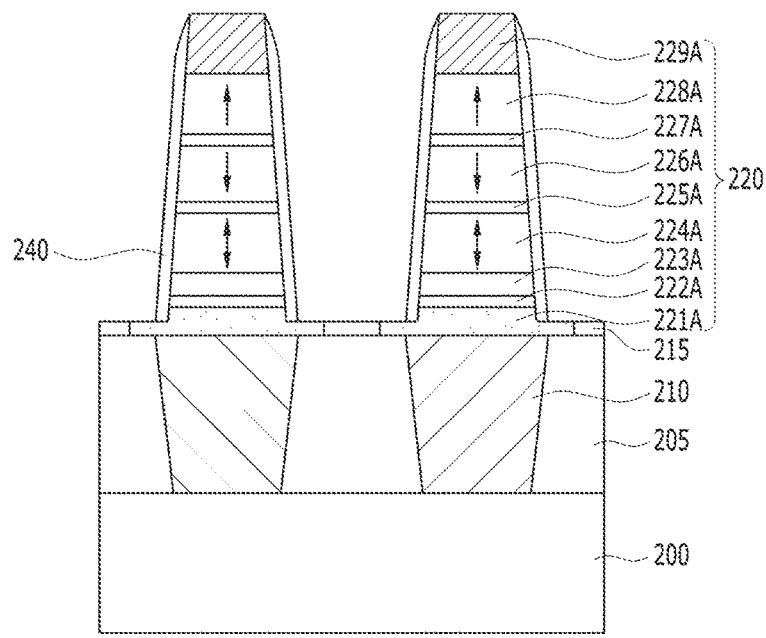
Figure 2C:
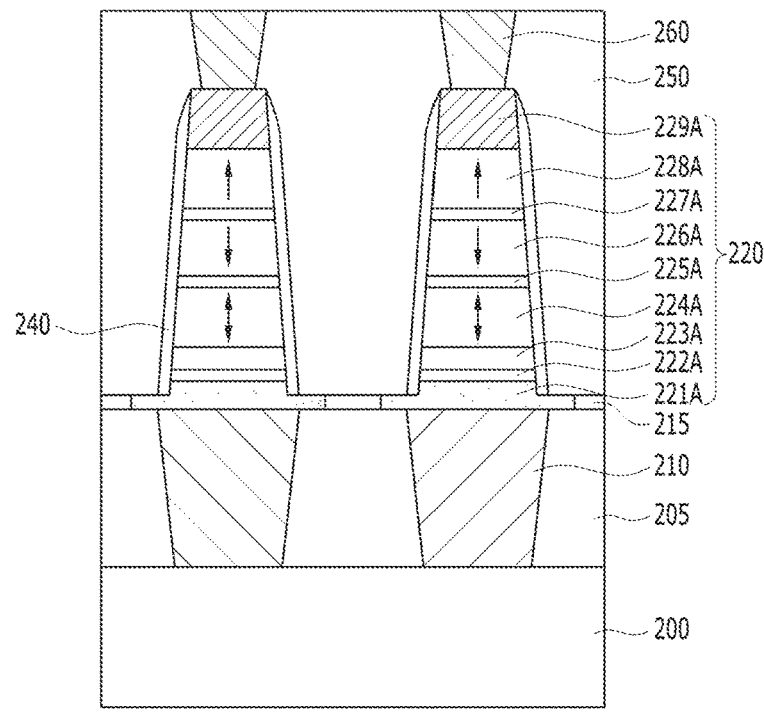

FIGS. 2A to 2C are cross-sectional views describing a semiconductor memory and a method for fabricating the semiconductor memory in accordance with an implementation of the present disclosure.

Referring to FIG. 2A, a substrate 200 where predetermined required structures such as a switching device (not shown), are formed may be provided. Here, the switching device is a constituent element to be coupled to a variable resistance element and control the supply of a current or voltage to the variable resistance element. For example, the switching device may include a transistor and a diode. The switching device may have one end to be electrically connected to a lower contact plug 210, which is to be described below, and the other end to be electrically connected to a line that is not illustrated in the drawing, such as a source line.

Subsequently, a first interlayer dielectric layer 205 may be formed over the substrate 200. The first interlayer dielectric layer 205 may include various insulating materials such as silicon oxide, silicon nitride or a combination thereof.

Subsequently, the lower contact plug 210 may be formed to pass through the first interlayer dielectric layer 205 and be coupled to a portion of the substrate 200. For example, the lower contact plug 210 may be coupled to an end of the switching element of the substrate 200. The lower contact plug 210 may be formed by selectively etching the first interlayer dielectric layer 205 to form a contact hole exposing a portion of the substrate 200, depositing a conductive material in a thickness that sufficiently fills the contact hole and performing a planarization process such as a CMP process until an upper surface of the first interlayer dielectric layer 205 is exposed. The lower contact plug 210 may include a conductive material having an excellent filling property and high electrical conductivity, for example, a metal such as tungsten (W), tantalum (Ta), or any other metal, or metal nitride such as titanium nitride (TiN), or others.

Subsequently, a second interlayer dielectric layer 215 may be formed on the first interlayer dielectric layer 205 and the lower contact plug 210, and then a lower electrode layer 221 passing through the second interlayer dielectric layer 215 and coupled to the lower contact plug 210 may be formed. The lower electrode layer 221 is a part of the variable resistance element and may be distinguished from the lower contact plug 210 to couple the variable resistance element to another device. The lower electrode layer 221 may be formed by selectively etching the second interlayer dielectric layer 215 to form a contact hole exposing the lower contact plug 210, depositing a conductive material in a thickness that sufficiently fills the contact hole and performing a planarization process such as a CMP process until an upper surface of the second interlayer dielectric layer 215 is exposed. As a result, the lower electrode layer 221 may have a planarized upper surface. The lower electrode layer 221 may be buried in the contact holes in order to reduce a height of an etch target during an etch process for fabricating the variable resistance element and make it easy to perform the etch process.

In the implementation, the lower electrode layer 221 may include an amorphous metallic carbon layer. The metallic carbon layer may mean a layer which is electrically conductive and include carbon. The amorphous metallic carbon layer may be in an amorphous state which is the same as or similar to that of amorphous carbon, but have more sp2 bonds than the amorphous carbon. Therefore, the amorphous metallic carbon layer is conductive and can be used as the lower electrode layer 221. This amorphous metallic carbon layer may be deposited by sputtering using a carbon target.

Meanwhile, in the implementation, the lower contact plug 210 may be formed in the hole within the first interlayer dielectric layer 205 and the lower electrode layer 221 may be formed in the hole within the second interlayer dielectric layer 215 so that sidewalls of the lower contact plug 210 and lower electrode layer 221 may not be aligned with each other. However, in another implementation, similarly to the comparative example, the lower contact plug 210 and the lower electrode layer 221 may be formed in one hole within a same interlayer dielectric layer and thus have sidewalls that are aligned with each other. Moreover, in the implementation, the lower electrode layer 221 may overlap with the lower contact plug 210 and have a width that is greater than that of the lower contact plug 210. However, in another implementation, a position and a width of the lower electrode layer 221 may be changed as long as the lower electrode layer 221 is coupled to the lower contact plug 210.

Subsequently, material layers 222 to 229 for forming a remaining part of the variable resistance element other than the lower electrode layer 221 may be formed on the second interlayer dielectric layer 215 and the lower electrode layer 221. In the implementation, the material layers 222 to 229 may include a buffer layer 222, a seed layer 223, a free layer 224, a tunnel barrier layer 225, a pinned layer 226, an exchange coupling layer 227, a magnetic correction layer 228 and a capping layer 229 which are sequentially stacked.

Here, the free layer 224 having a changeable magnetization direction, the pinned layer 226 having a fixed magnetization direction and the tunnel barrier layer 225 interposed between the free layer 224 and the pinned layer 226 and allowing the tunneling of electrons during a data write operation that changes the resistance state of the variable resistance element may form a Magnetic Tunnel Junction (MTJ) structure. Each of the free layer 224 and the pinned layer 226 may have a single-layer structure or a multi-layer structure that includes a ferromagnetic material. The ferromagnetic material may include an alloy containing Fe, Ni or Co as a major component such as an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy, or a stacked structure such as Co/Pt, or Co/Pd. In implementations, the upper and lower positions of the free layer 224 and the pinned layer 226 may be changed with each other with the tunnel barrier layer 225 therebetween. For example, the free layer 224 may be disposed on the tunnel barrier layer 225 and the pinned layer 226 may be disposed under the tunnel barrier layer 225 and on the seed layer 223. The tunnel barrier layer 225 may have a single-layer structure or a multi-layer structure including metal oxide such as MgO, CaO, SrO, TiO, VO, or NbO.

The seed layer 223 may help a magnetic layer disposed on the seed layer 223 to grow to have a desired crystalline structure and/or lattice structure. For example, the seed layer 223 may have a crystalline structure so as to improve perpendicular magnetic crystalline anisotropy of the magnetic layer disposed on the seed layer 223. In one implementation, the seed layer 223 may be disposed under the free layer 224 and help growth of the free layer 224. However, in another implementation, when the pinned layer 226 is disposed on the seed layer 223, the seed layer 223 may help growth of the pinned layer 226. The seed layer 223 may include a metal-containing material. For example, the seed layer 223 may have a single-layer structure or a multi-layer structure including a metal such as Hf, Mg, Zr, Nb, Mo, Ta, W, or Ti, or an oxide of the metal or nitride of the metal.

The buffer layer 222 may be interposed between the lower electrode layer 221 and the seed layer 223 so that the lower electrode layer 221 does not exert an influence on the crystallinity of the seed layer 223. The buffer layer 222 may include a metal-containing material. For example, the buffer layer 222 may have a single-layer structure or a multi-layer structure including a metal such as Hf, Mg, Zr, Nb, Mo, Ta, W, or Ti, or an oxide of the metal or nitride of the metal. In the implementation, a thickness T2 of the buffer layer 222 may be decreased in comparison with a thickness of the buffer layer (see, 122 of FIG. 1A) of the comparative example. Further, the buffer layer 222 may be omitted so that the lower electrode layer 221 and the seed layer 223 may come in direct contact with each other. Since the lower electrode layer 221 itself is in an amorphous state, and thus does not significantly exert an influence on the crystallinity of the seed layer 223, it is possible to reduce the thickness T2 of the buffer layer 222 or omit the buffer layer 222.

The magnetic correction layer 228 may be disposed on the pinned layer 226 and offset or reduce an influence of a stray field generated by the pinned layer 226 so as to reduce a bias magnetic field in the free layer 224 due to the stray field of the pinned layer 226. For this purpose, the magnetic correction layer 228 may have a magnetization direction opposite to that of the pinned layer 226 and have a single-layer structure or a multi-layer structure including a ferromagnetic material.

The exchange coupling layer 227 may be interposed between the pinned layer 226 and the magnetic correction layer 228 to provide an exchange coupling therebetween. Specifically, the exchange coupling layer 227 may provide an exchange coupling between the pinned layer 226 and the magnetic correction layer 228 so as to have magnetization directions anti-parallel to each other. The exchange coupling layer 227 may include a noble metal such as Ru, or others.

The capping layer 229 may be disposed in an uppermost portion of the variable resistance element to function as both an upper electrode of the variable resistance element and a hard mask for patterning the variable resistance element as described below. On this account, the capping layer 229 may have a single-layer structure or a multi-layer structure including various conductive materials such as a metal, or metal nitride.

Subsequently, a mask pattern 230 for patterning the variable resistance element may be formed on the capping layer 229. The mask pattern 230 may overlap with the lower electrode layer 221 and have a width narrower or smaller than that of the lower electrode layer 221. Specifically, a width of the mask pattern 230 may be controlled so that a width of a lower surface of a stacked structure (see, 222A to 229A of FIG. 2B) is narrower than that of an upper surface of the lower electrode layer 221 and thus, the whole stacked structure 222A to 229A is disposed on the lower electrode layer 221. This is because it is important to dispose the layers included in the variable resistance element over the planarized surface in order to secure characteristics of the variable resistance element. The mask pattern 230 may include various conductive materials such as a metal, metal nitride, etc.

Referring to FIG. 2B, the capping layer 229, the magnetic the correction layer 228, the exchange coupling layer 227, the pinned layer 226, the tunnel barrier layer 225, the free layer 224, the seed layer 223 and the buffer layer 222 may be etched using the mask pattern 230 as a etch barrier so as to form a stacked structure 222A to 229A where a buffer layer pattern 222A, a seed layer pattern 223A, free layer pattern 224A, a tunnel barrier layer pattern 225A, a pinned layer pattern 226A, an exchange coupling layer pattern 227A, a magnetic correction layer pattern 228A and a capping layer pattern 229A are piled up. This etch process may be performed by a method having a strong physical etching characteristic such as an Ion Beam Etching (IBE) method. As such, the stacked structure 222A to 229A may have a shape where a width is increased downwardly. Here, a width of a lower surface of the stacked structure 222A to 229A may be narrower than that of an upper surface of the lower electrode layer 221, and thus, a portion of the upper surface of the lower electrode layer 221 may be exposed by forming the stacked structure 222A to 229A.

During this etch process, an over etch process may be performed to separate the adjacent stacked structures 222A to 229A, and as a result, portions of the lower electrode layer 221 and the second interlayer dielectric layer 215 that are exposed by forming the stacked structure 222A to 229A may be etched. The lower electrode layer 221 in which a portion is etched may be referred to as a lower electrode 221A. As such, a variable resistance element 220 in which the lower electrode 221A, the buffer layer pattern 222A, the seed layer pattern 223A, the free layer pattern 224A, the tunnel barrier layer pattern 225A, the pinned layer pattern 226A, the exchange coupling layer pattern 227A, the magnetic correction layer pattern 228A and the capping layer pattern 229A are stacked may be formed. A lower portion of the lower electrode 221A may be buried in the second interlayer dielectric layer 215 and an upper portion of the lower electrode 221A may protrude therefrom. Moreover, the upper portion of the lower electrode 221A may have sidewalls which are aligned with the stacked structure 222A to 229A, while the lower portion of the lower electrode 221A may have sidewalls which are not aligned with the stacked structure 222A to 229A. During this etch process or by a separate removal process, the mask pattern 230 may be removed. Alternatively, although it is not shown, when the mask pattern 230 includes a conductive material, a portion of the mask pattern 230 may remain.

During this etch process, etch byproducts may be redeposited on sidewalls of the variable resistance element 220 so that a spacer 240 may be formed. The spacer 240 may mainly include a material contained in the buffer layer pattern 222A and the lower electrode 221A. This is because the buffer layer 222 and the lower electrode layer 221 are the layers which are etched after etching other layers of the stacked structures 222 to 229.

Here, since the buffer layer 222 has a thickness smaller than that of the comparative example or is omitted, the spacer 240 may mainly include carbon derived from the lower electrode layer 221, while it may not include or may include a very small amount of a metal derived from other layers of the stacked structures 222 to 229 including the buffer layer 222. Although the lower electrode layer 221 includes a metallic carbon layer and thus, has conductivity, the etch byproducts derived from the lower electrode layer 221 may be pure carbon which loses electrical characteristics. Accordingly, since the spacer 240 mainly including such carbon has a good insulating property, even though an oxidation process is omitted, current leakage through the spacer 240 can be prevented. Even if the required insulating property is not satisfied due to a metal included in the spacer 240 and thus an oxidation process is required, since only a small amount of the metal is required to be oxidized, the strength of the oxidation process can be reduced in comparison with the comparative example. Accordingly, in accordance with this implementation, it is possible to omit the oxidation process or reduce the strength of the oxidation process.

When the oxidation process is omitted or the strength of the oxidation process is reduced, since the variable resistance element 220 does not need to go through the strong oxidation which has been required in the comparative example, it is possible to prevent deterioration of characteristics due to the oxidation of the variable resistance element 220. The spacer 240 or an oxide of the spacer 240 may cover sidewalls of the variable resistance element 220 so as to function as a protective layer for protecting the variable resistance element 220.

Referring to FIG. 2C, a third interlayer dielectric layer 250 covering a resultant structure of FIG. 2B may be formed. The third interlayer dielectric layer 250 may be formed by depositing an insulating material and performing a planarization process. Although it is not shown, before forming the third interlayer dielectric layer 250, an additional protective layer may be formed along the resultant structure of FIG. 2B.

Subsequently, an upper contact plug 260 passing through the third interlayer dielectric layer 250 and electrically coupled to an upper end of the variable resistance element 220, that is, the capping layer pattern 229A may be formed. The upper contact plug 260 may be formed by selectively etching the third interlayer dielectric layer 250 to form a contact hole exposing the capping layer pattern 229A, depositing a conductive material in a thickness that sufficiently fills the contact hole and performing a planarization process until the third interlayer dielectric layer 250 is exposed. The upper contact plug 260 may include a conductive material having an excellent filling property and high electrical conductivity, such as tungsten (W), tantalum (Ta), or a titanium nitride (TiN).

Subsequently, although it is not shown, lines that are electrically coupled to the upper contact 260, for example, bit lines, may be formed over the third interlayer dielectric layer 250 and the upper contact plug 260.

The semiconductor memory shown in FIG. 2C may be fabricated through the process described above.

Referring back to FIG. 2C, the semiconductor memory in accordance with the implementation of the present disclosure may include the lower contact plug 210 disposed over the substrate 200 and coupled to a portion of the substrate 200, the lower electrode 221A of the variable resistance element 220 disposed over the lower contact plug 210, coupled to the lower contact plug 210 and including the amorphous metallic carbon layer, the remaining part 222A to 229A of the variable resistance element 220 disposed over the lower electrode 221A and coupled to the lower electrode 221A, and the spacer 240 formed on the sidewalls of the variable resistance element 220.

Here, the upper portion of the lower electrode 221A may protrude from the second interlayer dielectric layer 215 and have sidewalls aligned with the remaining part 222A to 229A of the variable resistance element 220. The lower portions of the lower electrode 221A may be buried in the second interlayer dielectric layer 215. The lower portions of the lower electrode 221A have a width that is greater than that of the upper portion of the lower electrode 221A and have sidewalls that are not aligned with the remaining part 222A to 229A of the variable resistance element 220.

The remaining part 222A to 229A of the variable resistance element 220 may include the buffer layer pattern 222A, the seed layer pattern 223A, the free layer pattern 224A, the tunnel barrier layer pattern 225A, the pinned layer pattern 226A, the exchange coupling layer pattern 227A, the magnetic correction layer pattern 228A and the capping layer pattern 229A. The buffer layer pattern 222A may be omitted or have a reduced thickness in comparison with the case where a lower electrode including a metal is used as in the comparative example.

The spacer 240 may mainly include carbon and have an insulating property. In some implementations, the spacer 240 may further include a metal or metal oxide whose amount is smaller than the carbon included in the spacer 240. This metal may be the metal included in the buffer layer pattern 222A. In some implementations, according to the process, this metal may further include a metal included in the remaining part 223A to 229A of the variable resistance element 220. The oxide of this metal may have an insulating property.

The variable resistance element 220 may store data by switching between different resistance states according to a voltage or current applied to the upper end and lower end of the variable resistance element 220 through the lower contact plug 210 and the upper contact plug 260. In particular, the variable resistance element 220 may store data depending on the magnetization direction of the free layer pattern 224A. The magnetization direction of the free layer patter 224A may be changed according to a voltage or current applied to the variable resistance element 220 so as to be compared with the magnetization direction of the pinned layer pattern 226A. When the magnetization directions of the free layer pattern 224A and the pinned layer pattern 226A are parallel to each other, the variable resistance element 220 may be in a low resistance state and, for example, may store a particular designated digital data bit such as "1". When the magnetization directions of the free layer pattern 224A and the pinned layer pattern 226A are anti-parallel to each other, the variable resistance element 220 may be in a high resistance state and, for example, may store a particular designated digital data bit such as "0". The change of the magnetization direction of the free layer pattern 224A may be caused by spin transfer torque.

The magnetization directions of the free layer pattern 224A and the pinned layer pattern 226A may be perpendicular to an interface of the layers, for example, an interface between the free layer pattern 224A and the tunnel barrier layer pattern 225A as shown in FIG. 2C. In some implementations, the variable resistance element 220 may include a perpendicular MTJ structure. The magnetization direction of the magnetic correction layer pattern 228A may be opposite to that of the pinned layer pattern 226A. As a result, as shown in FIG. 2C, when the pinned layer pattern 226A has a downward magnetization direction, the magnetic correction layer pattern 228A may have an upward magnetization direction. When the pinned layer pattern 226A has an upward magnetization direction, the magnetic correction layer pattern 228A may have a downward magnetization direction.

According to the semiconductor memory and the method for fabricating the same as described above, since the amorphous metallic carbon layer is used as the lower electrode 221A, it is possible to omit the buffer layer pattern 222A or reduce a thickness of the buffer layer pattern 222A. As such, since the spacer 240 mainly includes carbon, even though the oxidation process is omitted or the strength of the oxidation process is reduced, current leakage though the spacer 240 can be prevented. Moreover, undesired oxidation to the variable resistance element 220 can be prevented so as to secure characteristics of the variable resistance element 220.

Meanwhile, although in the above implementation, the oxidation process is performed after forming the variable resistance element 220, another implementation may be possible. For example, in some implementations, before the lower electrode layer 221 including carbon is over etched, an oxidation process for oxidizing conductive etch byproducts that have been generated by that time may be further performed. This will be described in detail with reference to FIGS. 3A to 3D.

FIGS. 3A to 3D are cross-sectional views describing a semiconductor memory and a method for fabricating the semiconductor memory in accordance with another implementation of the present disclosure. A detailed description for substantially the same parts as the above implementation is omitted.

Figure 3A:
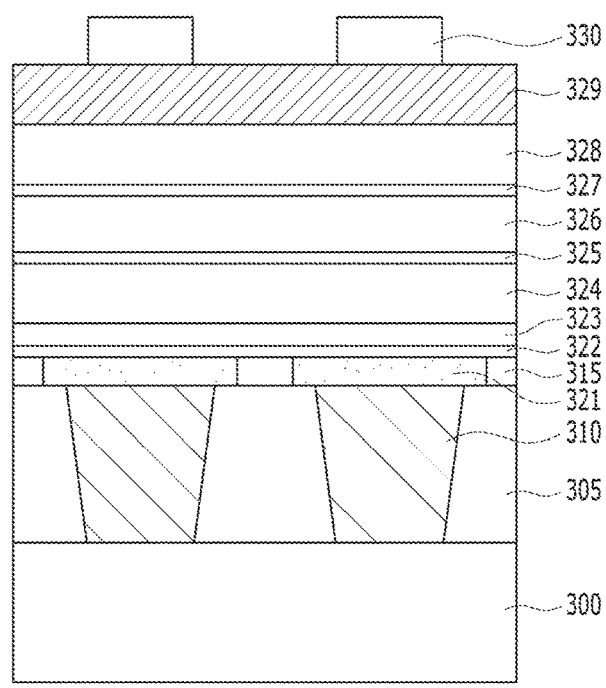
FIGS. 3A to 3D are cross-sectional views describing a semiconductor memory and a method for fabricating the semiconductor memory in accordance with one implementation of the present disclosure.

Referring to FIG. 3A, a first interlayer dielectric layer 305 may be formed over a substrate 300 where predetermined required structures (not shown) are formed and a lower contact plug 310 passing through the first interlayer dielectric layer 305 and coupled to a portion of the substrate 300 may be formed.

Subsequently, a second interlayer dielectric layer 315 may be formed over the first interlayer dielectric layer 305 and the lower contact plug 310 and a lower electrode layer 321 passing through the second interlayer dielectric layer 315 and coupled to the lower contact plug 310 may be formed. Here, the lower electrode layer 321 may include an amorphous metallic carbon layer.

Subsequently, material layers 322 to 329 for forming a remaining part of a variable resistance element other than the lower electrode layer 321 may be formed over the second interlayer dielectric layer 315 and the lower electrode layer 321. The material layers 322 to 329 may include a buffer layer 322, a seed layer 323, a free layer 324, a tunnel barrier layer 325, a pinned layer 326, an exchange coupling layer 327, a magnetic correction layer 328 and a capping layer 329 which are sequentially stacked. Since the lower electrode layer 321 includes the amorphous metallic carbon layer, the buffer layer 322 can be omitted or have a thin thickness.

Subsequently, a mask pattern 330 for patterning the variable resistance element may be formed over the capping layer 329.

Figure 3B:
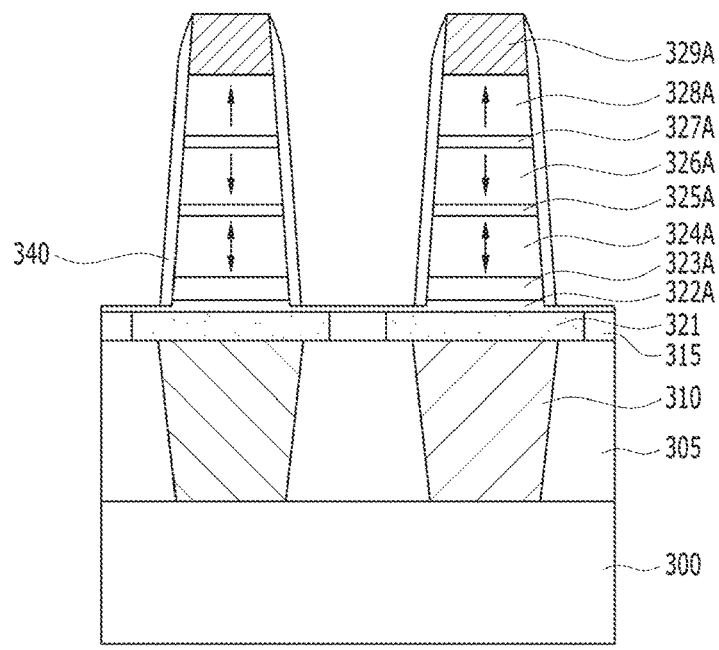

Referring to FIG. 3B, a stacked structure 322A to 329A including an initial buffer layer pattern 322A, a seed layer pattern 323A, a free layer pattern 324A, a tunnel barrier layer pattern 325A, a pinned layer pattern 326A, an exchange coupling layer pattern 327A, a magnetic correction layer pattern 328A and a capping layer pattern 329A may be formed by etching the capping layer 329, the magnetic correction layer 328, the exchange coupling layer 327, the pinned layer 326, the tunnel barrier layer 325, the free layer 324, the seed layer 323 and the buffer layer 322 using the mask pattern 330 as an etch barrier. This etch process may be performed by a physical etch process such as IBE. Moreover, this etch process may be performed as under etching so as not to expose the lower electrode layer 321. As a result, a portion of the buffer layer 322 may not be etched to remain. Referring to FIG. 3B, the buffer layer 322 exists over both the lower electrode layer 321 that is positioned under the seed layer 323 and other portions of the lower electrode layer 321 and the second interlayer dielectric layer 315. A thickness of the portion of the buffer layer 322 that is positioned not under the seed layer 323 may be significantly thinner than a thickness of the buffer layer 322 that is positioned under the seed layer 323.

During this etch process, etch byproducts may be redeposited on sidewalls of the stacked structure 322A to 329A to form a first initial spacer 340. The first initial spacer 340 may mainly include a metal contained in the buffer layer 322 which is etched at a later time than other layers of the stacked structures 323 to 329.

Figure 3C:
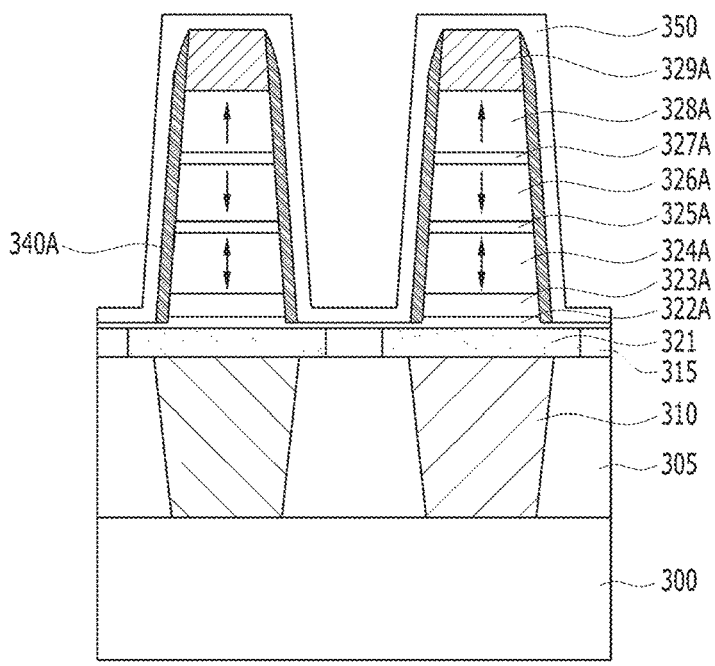

Referring to FIG. 3C, an oxidation process may be performed so as to change the first initial spacer 340 into a first spacer 340A including insulating metal oxide. Here, it has been already explained that since the amorphous metallic carbon layer is used as the lower electrode layer 321, the buffer layer 322 may be omitted or have a thickness that is thinner than that of the buffer layer of the comparative example (see the buffer layer 122 of FIG. 1A). As a result, since an amount of the metal included in the first initial spacer 340 may be reduced in comparison with the spacer of the comparative example (see, the spacer 140 of FIG. 1B), the strength of the oxidation process that is performed on the metal can be decreased. Accordingly, it is possible to prevent or reduce the oxidation of a sidewall of the stacked structure 322A to 329A.

Subsequently, an additional spacer 350 may be formed along a resultant structure where the oxidation process has been performed. The additional spacer 350 may serve to further protect the formed stacked structure 322A to 329A. In some implementations, the additional spacer 350 may be omitted. The additional spacer 350 may include various insulating materials such as silicon nitride, silicon nitride or a combination thereof.

Figure 3D:
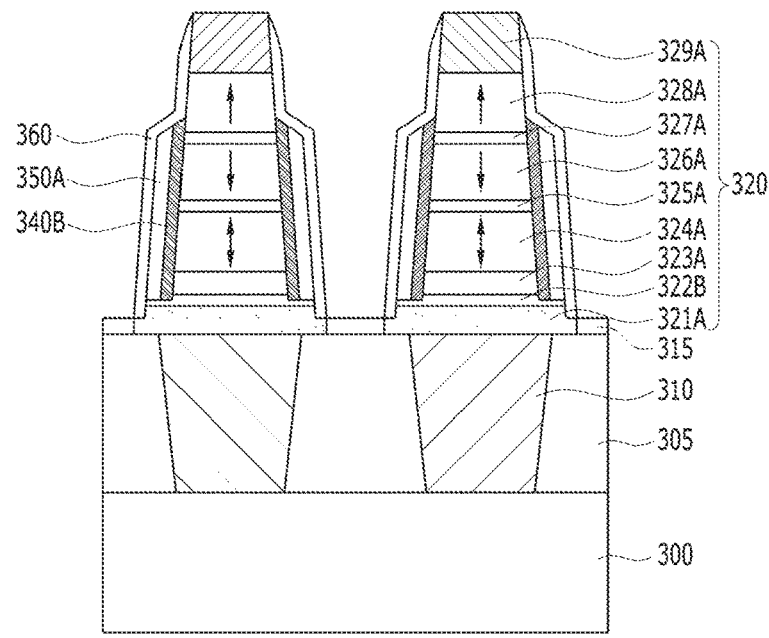

Referring to FIG. 3D, an additional spacer pattern 350A and a first spacer pattern 340B may be formed on sidewalls of the stacked structure 322A to 329A by performing a blanket etch process to the additional spacer 350 and/or the first spacer 340A. During the blanket etch process, a portion of the additional spacer 350 that is parallel to an upper surface of the substrate 300 may be removed so as to expose the initial buffer layer pattern 322A.

Subsequently, the initial buffer layer pattern 322A may be etched by using the additional spacer pattern 350A and the first spacer pattern 340B as an etch barrier. Accordingly, the portions of the lower electrode layer 321 and the second interlayer dielectric layer 315 are exposed. The exposed portions of the lower electrode layer 321 and the second interlayer dielectric layer 315 may be removed by an over etch process. As a result, a variable resistance element 320 in which a lower electrode 321A, a buffer layer pattern 322B, the seed layer pattern 323A, the free layer pattern 324A, the tunnel barrier layer pattern 325A, the pinned layer pattern 326A, the exchange coupling layer pattern 327A, the magnetic correction layer pattern 328A and the capping layer pattern 329A are stacked may be formed. In the blanket etch process described above and/or this present etch process, an upper portion of the additional spacer pattern 350A and the first spacer pattern 340B may be removed so that the additional spacer pattern 350A and the first spacer pattern 340B are formed on lower portions of the sidewalls of the variable resistance element 320 and may have a shape spaced downwardly from the capping layer pattern 329A. As a result, the first spacer pattern 340B may be positioned downwardly by a predetermined distance from an uppermost portion of the variable resistance element 320, and the additional spacer pattern 350A may be disposed on outer sidewalls of the first spacer pattern 340B. A lower portion of the lower electrode 321A may be buried in the second interlayer dielectric layer 215, and an upper portion of the lower electrode 321A may have a width smaller than that of the lower portion so as to have a shape which protrudes from the second interlayer dielectric layer 215. A lower portion of the buffer layer pattern 322B may have sidewalls aligned with the upper portion of the lower electrode 321A, and an upper portion of the buffer layer pattern 322B may have a width smaller than that of the lower portion and have sidewalls aligned with the stacked structure 323A to 329A. Moreover, the lower portion of the buffer layer pattern 322B and the upper portion of the lower electrode 321A may have sidewalls aligned with outer sidewalls of the additional spacer pattern 350A.

In this etch process, etch byproducts may be redeposited along the additional spacer pattern 350A, the first spacer pattern 340B and sidewalls of the variable resistance element 320 that are not covered by the additional spacer pattern 350A and first spacer pattern 340B to form a second spacer 360. The second spacer 360 may mainly include carbon contained in the lower electrode 321A. As described above, since a remaining buffer layer 322 which is not etched when forming the initial buffer layer pattern 322A has a very thin thickness, the second spacer 360 may hardly include a metal contained in the buffer layer pattern 322B. Therefore, even though an oxidation process is not performed, the second spacer 360 may have an excellent insulating property. Even if an oxidation process to the second spacer 360 is performed, the strength of the oxidation process can be significantly low. Accordingly, the oxidation process to the second spacer 360 may not exert an influence on a portion of the variable resistance element 320, for example, the magnetic correction layer pattern 328A.

Subsequently, although it is not shown, it is possible to perform a process for forming an interlayer dielectric layer covering a resultant structure of FIG. 3D and forming an upper contact plug passing through the interlayer dielectric layer and coupled to an upper end of the variable resistance element 320.

The semiconductor memory shown in FIG. 3D may be fabricated through the process described above.

Referring back to FIG. 3D, the semiconductor memory in accordance with the implementation of the present disclosure may include the lower contact plug 310 disposed over the substrate 300 and coupled to a portion of the substrate 300, the lower electrode 321A of the variable resistance element 320 disposed over the lower contact plug 310, coupled to the lower contact plug 310 and including the amorphous metallic carbon layer, the remaining part 322B to 329A of the variable resistance element 320 disposed over the lower electrode 321A and coupled to the lower electrode 321A, the first spacer pattern 340B and the additional spacer pattern 350A formed on at least a portion of the sidewalls of the variable resistance element 320 and the second spacer 360 formed along the first spacer pattern 340B, the additional spacer pattern 350A and the sidewalls of the variable resistance element 320 exposed by the first spacer pattern 340B and the additional spacer pattern 350A.

The remaining part 322B to 329A of the variable resistance element 320 may include the buffer layer pattern 322B, the seed layer pattern 323A, the free layer pattern 324A, the tunnel barrier layer pattern 325A, the pinned layer pattern 326A, the exchange coupling layer pattern 327A, the magnetic correction layer pattern 328A and the capping layer pattern 329A. The buffer layer pattern 322B may be omitted or have a thin thickness.

Here, the lower portion of the lower electrode 321A may be buried in the second interlayer dielectric layer 315, and the upper portion of the lower electrode 321A may have a width smaller than that of the lower portion and protrude from the second interlayer dielectric layer 315. The upper portion of the lower electrode 321A may have the sidewalls aligned with the sidewalls of the lower portion of the buffer layer pattern 322B and the outer sidewalls of the additional spacer pattern 350A. The upper portion of the buffer layer pattern 322B may have a width smaller than the lower portion of the buffer layer pattern 322B and have the sidewalls aligned with the sidewalls of the stacked structure 323A to 329A.

The first spacer pattern 340B may include insulating metal oxide. The metal included in the first spacer pattern 340B may be the metal included in the buffer layer pattern 322B. In some implementations, according to the process, the first spacer pattern 340B may further include a metal included in the remaining part 322B to 329A of the variable resistance element 320. The additional spacer pattern 350A may include a material different from the first spacer pattern 340B, for example, an insulating material such as silicon oxide, silicon nitride or a combination thereof. The second spacer 360 may mainly include carbon and further include a metal or metal oxide thereof in a small amount in comparison with the carbon. The metal included in the second spacer 360 may be the metal included in the buffer layer pattern 322B.

Meanwhile, although, in the above implementations, the amorphous metallic carbon layer is used as the lower electrode layers 221 and 321, the amorphous metallic carbon layer may be used as a portion or all of the buffer layers 222 and 322 instead of the lower electrode layers 221 and 321. This will be described in detail with reference to FIGS. 4A to 7B.

Figure 4A:
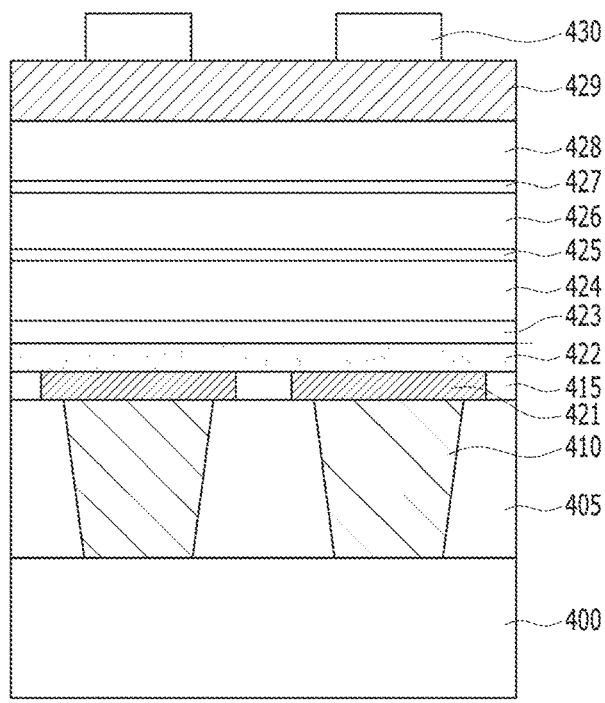
FIGS. 4A to 4C are cross-sectional views describing a semiconductor memory and a method for fabricating the semiconductor memory in accordance with one implementation of the present disclosure.
Figure 4B:
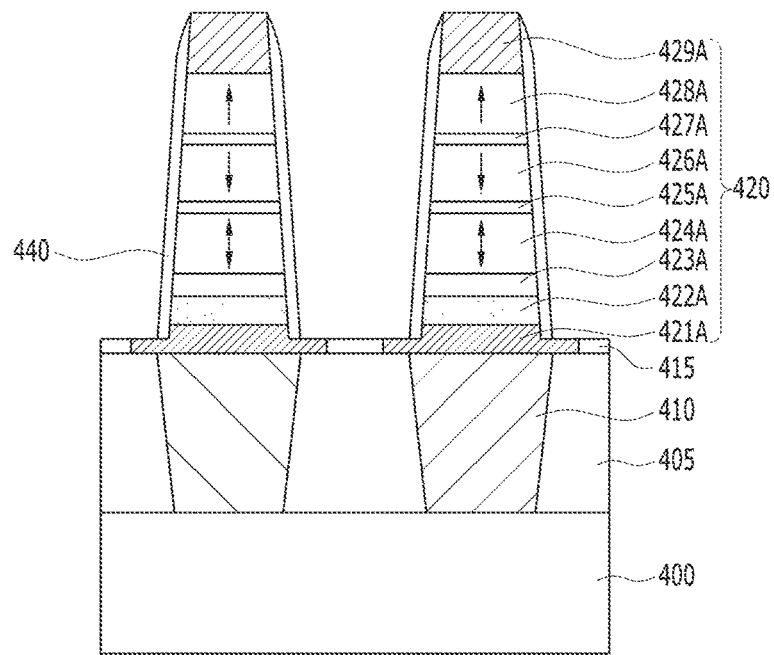
Figure 4C:
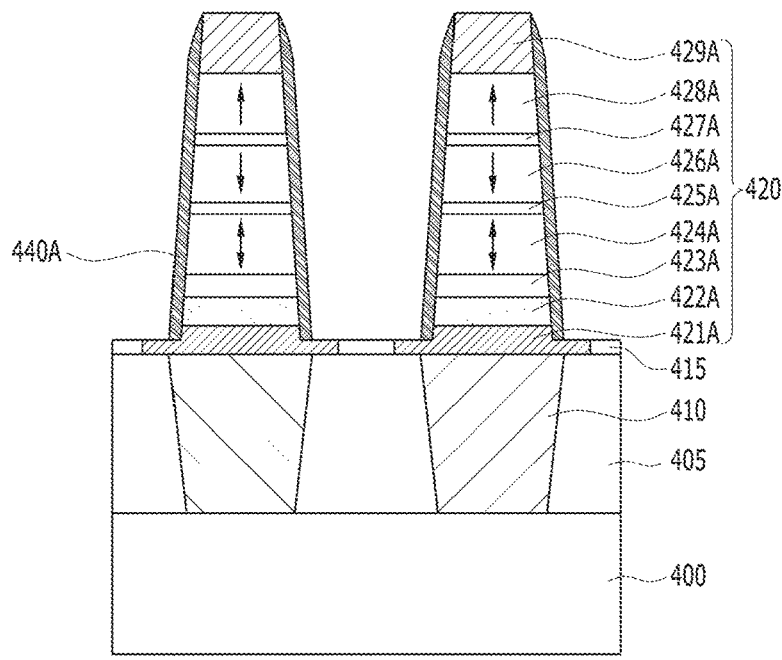

FIGS. 4A to 4C are cross-sectional views describing a semiconductor memory and a method for fabricating the semiconductor memory in accordance with still another implementation of the present disclosure. A detailed description for substantially the same parts as the above implementations is omitted.

Referring to FIG. 4A, a first interlayer dielectric layer 405 may be formed over a substrate 400 where predetermined required structures (not shown) are formed and a lower contact plug 410 passing through the first interlayer dielectric layer 405 and coupled to a portion of the substrate 400 may be formed.

Subsequently, a second interlayer dielectric layer 415 may be formed over the first interlayer dielectric layer 405 and the lower contact plug 410 and a lower electrode layer 421 passing through the second interlayer dielectric layer 415 and coupled to the lower contact plug 410 may be formed. Here, the lower electrode layer 421 may have a single-layer structure or a multi-layer structure including a metal-containing material such as a metal, metal nitride or a combination thereof.

Subsequently, material layers 422 to 429 for forming a remaining part of a variable resistance element other than the lower electrode layer 421 may be formed over the second interlayer dielectric layer 415 and the lower electrode layer 421. The material layers 422 to 429 may include a buffer layer 422, a seed layer 423, a free layer 424, a tunnel barrier layer 425, a pinned layer 426, an exchange coupling layer 427, a magnetic correction layer 428 and a capping layer 429. Here, the buffer layer 422 may include an amorphous metallic carbon layer. In some implementations, a thickness of the buffer layer 422 may be thick contrary to the above implementations. The buffer layer 422 may have a thickness similar to that of the comparative example.

Subsequently, a mask pattern 430 for patterning the variable resistance element may be formed over the capping layer 429.

Referring to FIG. 4B, a stacked structure 422A to 429A including a buffer layer pattern 422A, a seed layer pattern 423A, a free layer pattern 424A, a tunnel barrier layer pattern 425A, a pinned layer pattern 426A, an exchange coupling layer pattern 427A, a magnetic correction layer pattern 428A and a capping layer pattern 429A may be formed by etching the capping layer 429, the magnetic correction layer 428, the exchange coupling layer 427, the pinned layer 426, the tunnel barrier layer 425, the free layer 424, the seed layer 423 and the buffer layer 422 using the mask pattern 430 as an etch barrier. Moreover, portions of the lower electrode layer 421 and the second interlayer dielectric layer 415 which are exposed by forming the stacked structure 422A to 429A may be removed by an over etch process. As a result, a variable resistance element 420 in which the lower electrode 421A, the buffer layer pattern 422A, the seed layer pattern 423A, the free layer pattern 424A, the tunnel barrier layer pattern 425A, the pinned layer pattern 426A, the exchange coupling layer pattern 427A, the magnetic correction layer pattern 428A and the capping layer pattern 429A are stacked may be formed.

During this etch process, etch byproducts may be redeposited on sidewalls of the variable resistance element 420 to form an initial spacer 440. The initial spacer 440 may mainly include materials included in the buffer layer pattern 422A and the lower electrode 421A. Here, the initial spacer 440 may mainly include carbon derived from the buffer layer pattern 422A and further include a small amount of a metal derived from the lower electrode 421A. The reason why the amount of the metal included in the spacer 440 is smaller than that of the carbon is that the over-etching of the thick buffer layer 422 is dominant in comparison with the etching of the lower electrode layer 421 when performing the etch process for forming the variable resistance element 420. Accordingly, the spacer 440 may have an excellent insulating property. If the spacer 440 does not satisfy the required insulating property, an oxidation process to be described below may be performed.

Referring to FIG. 4C, an oxidation process may be performed so as to change the initial spacer 440 into a spacer 440A including insulating metal oxide. As described above, since the amount of the metal included in the initial spacer 440 is smaller than that of the carbon, the strength of the oxidation process can be low. As a result, it is possible to prevent or reduce the oxidation of a sidewall of the variable resistance element 420.

Subsequently, although it is not shown, it is possible to further perform a process for forming an interlayer dielectric layer covering a resultant structure of FIG. 4C and forming an upper contact plug passing through the interlayer dielectric layer and coupled to an upper end of the variable resistance element 420.

The semiconductor memory shown in FIG. 4C may be fabricated through the process described above.

Referring back to FIG. 4C, the semiconductor memory in accordance with the implementation of the present disclosure may include the lower contact plug 410 disposed over the substrate 400 and coupled to a portion of the substrate 400, the lower electrode 421A of the variable resistance element 420 disposed over the lower contact plug 410 and coupled to the lower contact plug 410, a remaining part 422A to 429A of the variable resistance element 420 disposed over the lower electrode 421A and coupled to the lower electrode 421A and the spacer 440A formed on the sidewalls of the variable resistance element 420.

Here, the buffer layer pattern 422A of the variable resistance element 420 may include the amorphous metallic carbon layer. Moreover, the spacer 440A may mainly include carbon and further include a metal or metal oxide thereof in a small amount in comparison with the carbon. The metal may include the metal included in the lower electrode 421A.

Figure 5:
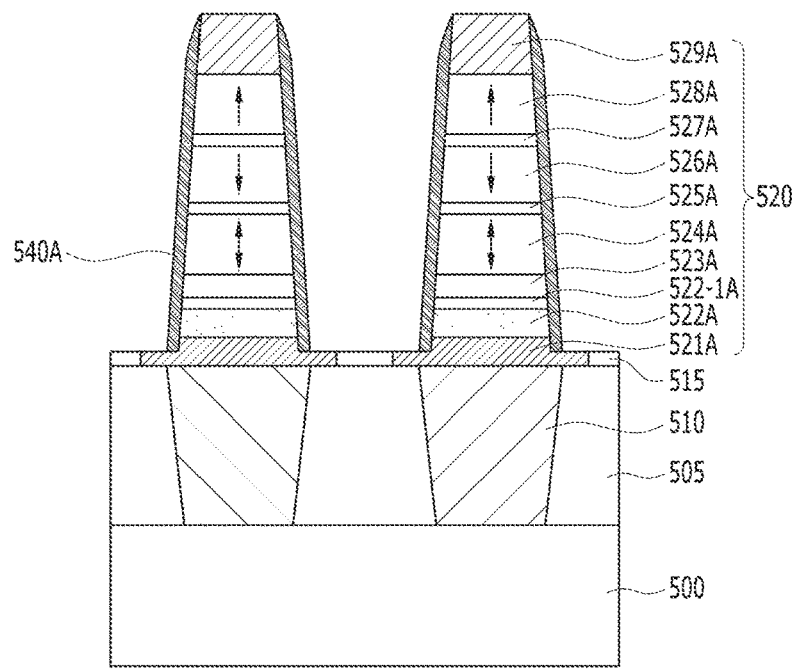
FIG. 5 is a cross-sectional view describing a semiconductor memory and a method for fabricating the semiconductor memory in accordance with one implementation of the present disclosure.

FIG. 5 is a cross-sectional view describing a semiconductor memory and a method for fabricating the semiconductor memory in accordance with further another implementation of the present disclosure. The following descriptions will be focused on differences of the present implementation from the implementation of FIGS. 4A to 4C.

Referring to FIG. 5, the semiconductor memory in accordance with the implementation may include a lower contact plug 510 disposed over a substrate 500 and coupled to a portion of the substrate 500, a lower electrode 521A of a variable resistance element 520 disposed over the lower contact plug 510 and coupled to the lower contact plug 510, a remaining part 522A to 529A of the variable resistance element 520 disposed over the lower electrode 521A and coupled to the lower electrode 521A and a spacer 540A formed on sidewalls of the variable resistance element 520.

Here, the buffer layer has a stacked structure including a first buffer layer pattern 522A and a second buffer layer pattern 522-1A. The first buffer layer pattern 522A includes an amorphous metallic carbon layer. The second buffer layer pattern 522-1A is disposed over the first buffer layer pattern 522A and may include a metal-containing material. In some implementations, the spacer 540A may mainly include carbon and further include a metal or metal oxide thereof in a small amount in comparison with the carbon.

This implementation differs from the implementation of FIGS. 4A to 4C in that only a portion of the buffer layer pattern, for example, a lower portion is the amorphous metallic carbon layer in the implementation, while all of the buffer layer pattern is the amorphous metallic carbon layer in the implementation of FIGS. 4A to 4C.

FIGS. 6A to 6D are cross-sectional views describing a semiconductor memory and a method for fabricating the semiconductor memory in accordance with still further another implementation of the present disclosure. A detailed description for substantially the same parts as the above implementation is omitted.

Figure 6A:
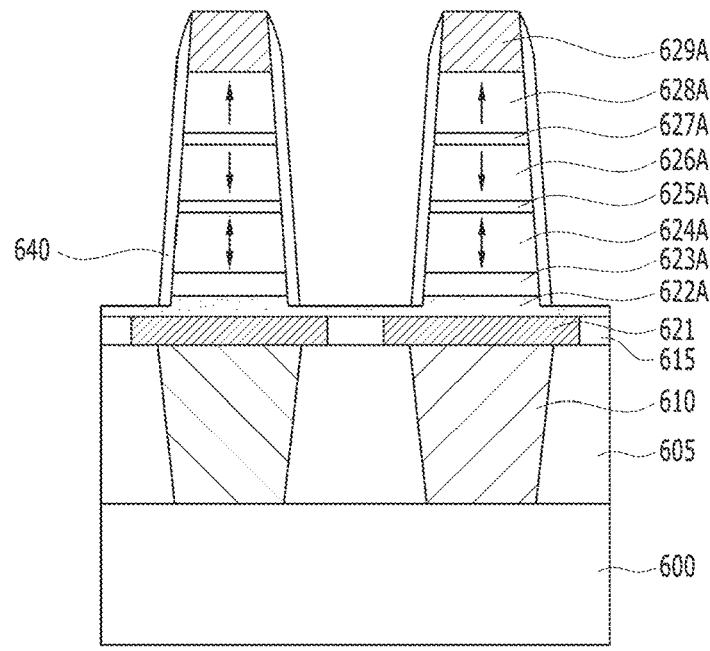
FIGS. 6A to 6D are cross-sectional views describing a semiconductor memory and a method for fabricating the semiconductor memory in accordance with one implementation of the present disclosure.

Referring to FIG. 6A, a first interlayer dielectric layer 605 may be formed over a substrate 600 where predetermined required structures (not shown) are formed, and then a lower contact plug 610 passing through the first interlayer dielectric layer 605 and coupled to a portion of the substrate 600 may be formed.

Subsequently, a second interlayer dielectric layer 615 may be formed over the first interlayer dielectric layer 605 and the lower contact plug 610 and a lower electrode layer 621 passing through the second interlayer dielectric layer 615 and coupled to the lower contact plug 610 may be formed. Here, the lower electrode layer 621 may have a single-layer structure or a multi-layer structure including a metal-containing material such as metal, metal nitride or a combination thereof.

Subsequently, a stacked structure 622A to 629A including an initial buffer layer pattern 622A, a seed layer pattern 623A, a free layer pattern 624A, a tunnel barrier layer pattern 625A, a pinned layer pattern 626A, an exchange coupling layer pattern 627A, a magnetic correction layer pattern 628A and a capping layer pattern 629A may be formed by depositing material layers for forming a remaining part of the variable resistance element other than the lower electrode layer 621 over the second interlayer dielectric layer 615 and the lower electrode layer 621, and then selectively etching the material layers. Here, this etch process may be performed as under etching so as not to expose the lower electrode layer 621, and thus a lower portion of the initial buffer layer pattern 622A may not be etched to remain with a thin thickness on a top surface of the substrate 600. The initial buffer layer pattern 622A may include an amorphous metallic carbon layer. Moreover, a total thickness of the initial buffer layer pattern 622A that is positioned between the lower electrode layer and the seed layer pattern 623A may have a thickness similar to that of the comparative example.

During this etch process, etch byproducts may be redeposited on sidewalls of the stacked structure 622A to 629A to form a first initial spacer 640. The first initial spacer 640 may mainly include carbon derived from the initial buffer layer pattern 622A. In addition, the first initial spacer 640 may further include a small amount of a metal derived from the seed layer pattern 623A. Accordingly, the first initial spacer 640 may have an excellent insulating property. When the first initial spacer 640 does not satisfy a required insulating property, an oxidation process to be described below may be performed.

Figure 6B:
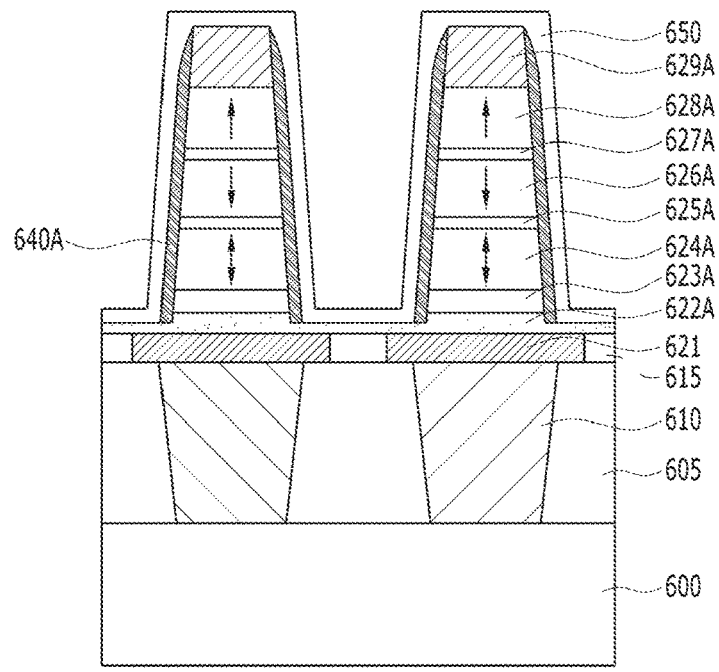

Referring to FIG. 6B, an oxidation process may be performed so as to change the first initial spacer 640 into a first spacer 640A including insulating metal oxide. As described above, since an amount of the metal included in the first initial spacer 640 is significantly smaller than that of the carbon, the strength of the oxidation process does not need to be high and can be small. As a result, even with the oxidation process, it is possible to prevent or reduce the oxidation of the sidewall of the variable resistance element 620.

Subsequently, an additional spacer 650 may be formed along a resultant structure in which the oxidation process has been performed. The additional spacer 650 may serve to further protect the stacked structure 622A to 629A. In some implementations, the additional spacer 650 can be omitted. The additional spacer 650 may include various insulating materials such as silicon nitride, etc.

Figure 6C:
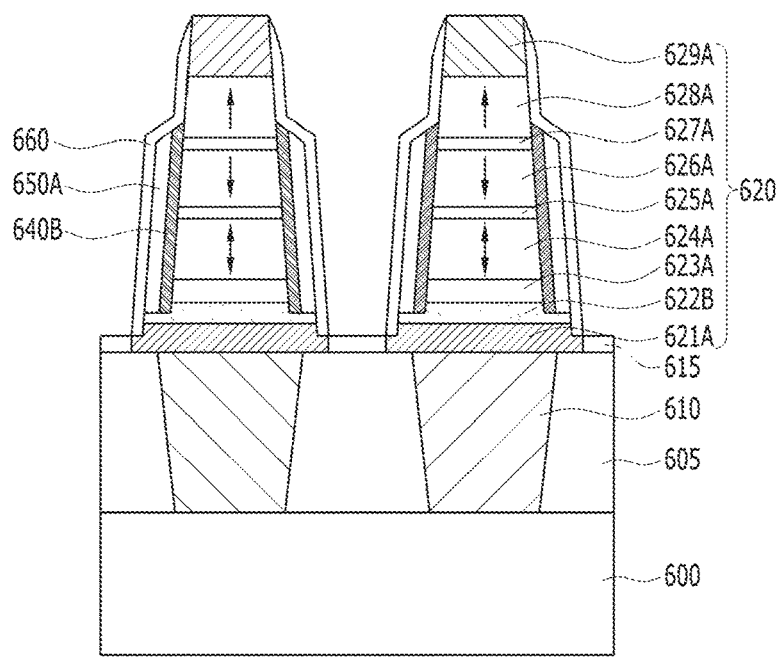

Referring to FIG. 6C, an additional spacer pattern 650A and a first spacer pattern 640B may be formed on sidewalls of the stacked structure 622A to 629A by performing a blanket etch process to the additional spacer 650 and/or the first spacer 640A.

Subsequently, the initial buffer layer pattern 622A may be etched by using the additional spacer pattern 650A and the first spacer pattern 640B as an etch barrier and portions of the lower electrode layer 621 and the second interlayer dielectric layer 615 may be exposed. The exposed portions of the lower electrode layer 621 and the second interlayer dielectric layer 615 may be removed by over etching. As a result, a variable resistance element 620 in which a lower electrode 621A, a buffer layer pattern 622B, the seed layer pattern 623A, the free layer pattern 624A, the tunnel barrier layer pattern 625A, the pinned layer pattern 626A, the exchange coupling layer pattern 627A, the magnetic correction layer pattern 628A and the capping layer pattern 629A are stacked may be formed. In the above blanket etch process and/or this etch process, upper portions of the additional spacer pattern 650A and the first spacer pattern 640B may be removed such that the additional spacer pattern 650A and the first spacer pattern 640B may have a shape spaced downwardly by a predetermined distance from an upper surface of the capping layer pattern 629A.

During this etch process, etch byproducts may be redeposited along the additional spacer pattern 650A, first spacer pattern 640B and sidewalls of the variable resistance element 620 which are not covered by the additional spacer pattern 650A and the first spacer pattern 640B so as to form an initial second spacer 660. The initial second spacer 660 may include a metal included in the lower electrode 621A. However, since most of the sidewalls of the variable resistance element 620 are covered by the additional spacer pattern 650A and the first spacer pattern 640B, current leakage through the initial second spacer 660 may not cause significant problems. But, in some cases, it may be required to change the initial second spacer 660 into an insulating material. In this case, a subsequent oxidation process may be performed as shown in FIG. 6D.

Figure 6D:
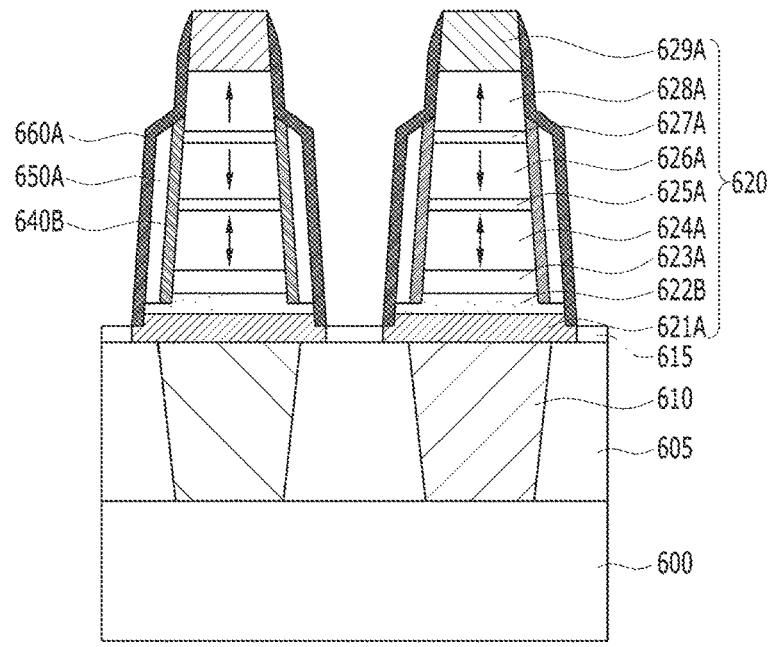

Referring to FIG. 6D, the initial second spacer 660 may be changed into a second spacer 660A including insulating metal oxide by performing an oxidation process. Since a portion of the variable resistance element 620 which is influenced during this oxidation process is relatively small, it is possible to reduce or prevent deterioration of characteristics of the variable resistance element 620.

Figure 7A:
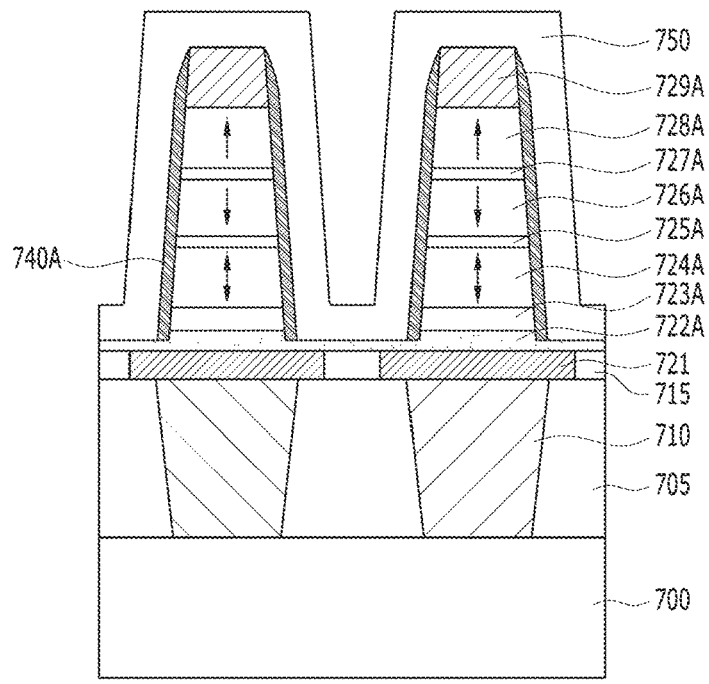
FIGS. 7A and 7B are cross-sectional views describing a semiconductor memory and a method for fabricating the semiconductor memory in accordance with one implementation of the present disclosure.
Figure 7B:
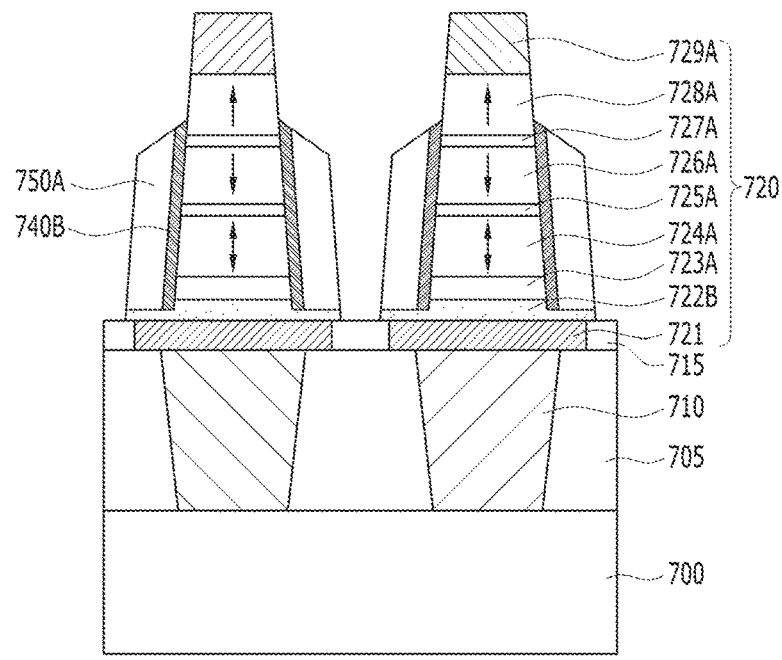

FIGS. 7A and 7B are cross-sectional views describing a semiconductor memory and a method for fabricating the semiconductor memory in accordance with yet another implementation of the present disclosure. The following descriptions will be focused on a difference from the implementation of FIGS. 6A to 6D.

Referring to FIG. 7A, substantially the same processes as those which have been performed before forming the additional spacer 650 shown in FIG. 6B may be performed. As a result, a resultant structure including a substrate 700, a first interlayer dielectric layer 705, a lower contact plug 710, a second interlayer dielectric layer 715, a lower electrode layer 721, an initial buffer layer pattern 722A, a seed layer pattern 723A, a free layer pattern 724A, a tunnel barrier layer pattern 725A, a pinned layer pattern 726A, an exchange coupling layer pattern 727A, a magnetic correction layer pattern 728A, a capping layer pattern 729A and a first spacer 740A may be obtained.

Subsequently, an additional spacer 750 may be formed along a front surface of the resultant structure. Specifically, a thickness of the additional spacer 750 may be thicker than that of the implementation of FIGS. 6A to 6D. This thickness may be controlled so that an additional spacer pattern (see, 750A of FIG. 7B) to be described below covers the lower electrode layer 721 and thus, the lower electrode layer 721 is not exposed despite etching the initial buffer layer pattern 722A.

Referring to FIG. 7B, an additional spacer pattern 750A and a first spacer pattern 740B may be formed by performing a blanket etch process to the additional spacer 750 and/or the first spacer 740A.

Subsequently, a buffer layer pattern 722B may be formed by etching the initial buffer layer pattern 722A using the additional spacer pattern 750A and the first spacer pattern 740B as an etch barrier. Here, since the lower electrode layer 721 is not exposed by controlling the thickness of the additional spacer 750, the lower electrode layer 721 cannot be etched. As a result, a variable resistance element 720 in which the lower electrode layer 721, the buffer layer pattern 722B, the seed layer pattern 723A, the free layer pattern 724A, the tunnel barrier layer pattern 725A, the pinned layer pattern 726A, the exchange coupling layer pattern 727A, the magnetic correction layer pattern 728A and the capping layer pattern 729A are stacked may be formed. Since the lower electrode layer 721 is not etched, etch byproducts derived from the lower electrode layer 721 may not be redeposited along the additional spacer pattern 750A, the first spacer pattern 740B, and sidewalls of the variable resistance element 720. Therefore, it is possible to omit a subsequent oxidation process or reduce the strength of the oxidation process.

The above and other memory circuits or semiconductor devices based on the disclosed technology can be used in a range of devices or systems. FIGS. 8-12 provide some examples of devices or systems that can implement the memory circuits disclosed herein.

Figure 8:
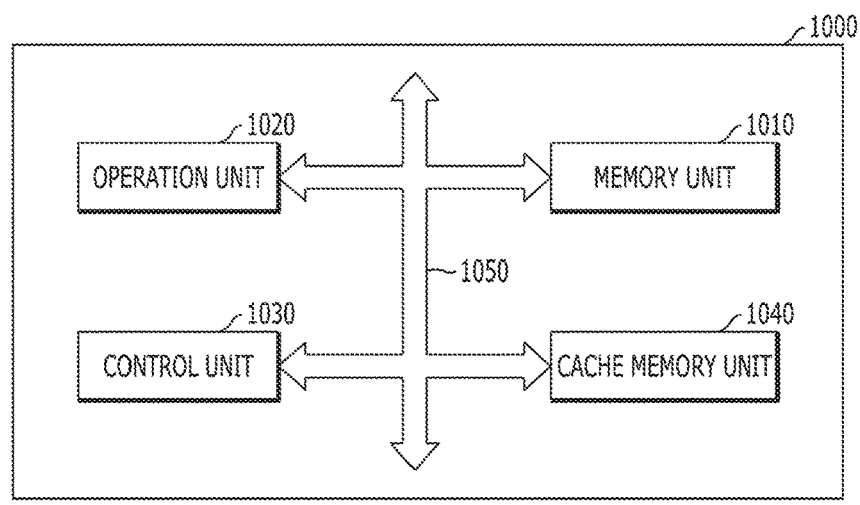
FIG. 8 is an example of configuration diagram of a microprocessor implementing memory circuitry based on the disclosed technology.

FIG. 8 is an example of configuration diagram of a microprocessor implementing memory circuitry based on the disclosed technology.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include one or more variable resistance elements each exhibiting different resistance states for storing data, and each of the variable resistance elements includes: a Magnetic Tunnel Junction (MTJ) structure including a free layer having a changeable magnetization direction, a pinned layer having a fixed magnetization direction and a tunnel barrier layer interposed between the free layer and the pinned layer; a seed layer disposed under the MTJ structure to facilitate a growth of the pinned layer or the free layer; and an amorphous metallic carbon layer disposed under the seed layer. Through this, data storage characteristics and operating characteristics of the memory unit 1010 may be improved.

As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 9:
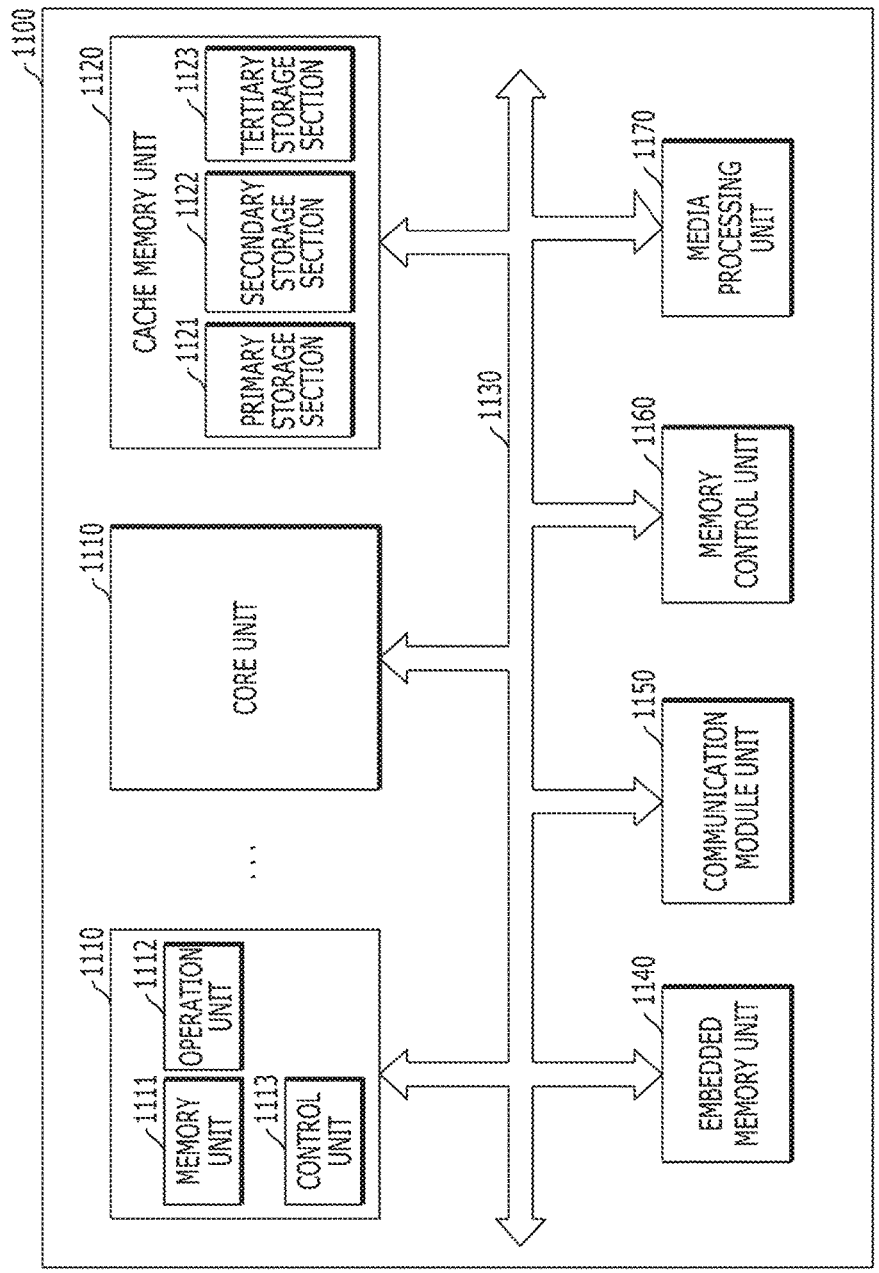
FIG. 9 is an example of configuration diagram of a processor implementing memory circuitry based on the disclosed technology.

FIG. 9 is an example of configuration diagram of a processor implementing memory circuitry based on the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include one or more variable resistance elements each exhibiting different resistance states for storing data, and each of the variable resistance elements includes: a Magnetic Tunnel Junction (MTJ) structure including a free layer having a changeable magnetization direction, a pinned layer having a fixed magnetization direction and a tunnel barrier layer interposed between the free layer and the pinned layer; a seed layer disposed under the MTJ structure to facilitate a growth of the pinned layer or the free layer; and an amorphous metallic carbon layer disposed under the seed layer. Through this, data storage characteristics and operating characteristics of the cache memory unit 1120 may be improved. As a consequence, operating characteristics of the processor 1100 may be improved.

Although it was shown in FIG. 9 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 10:
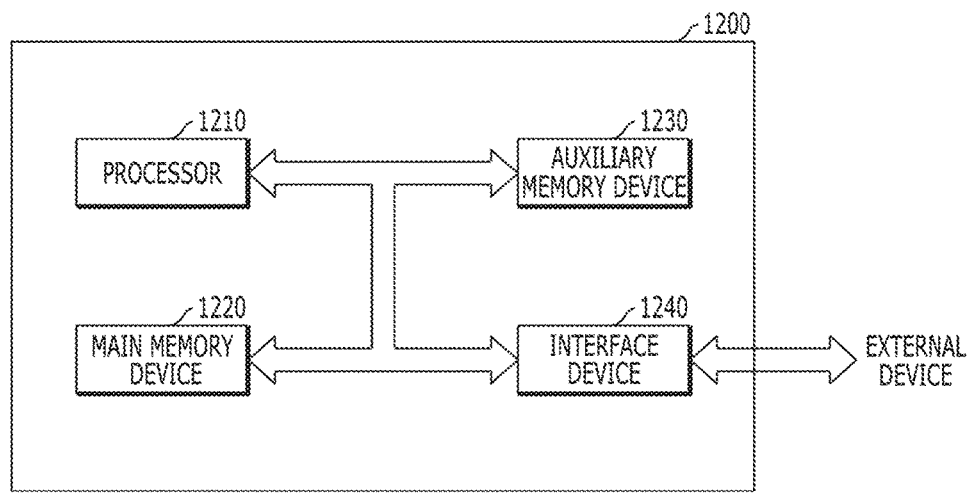
FIG. 10 is an example of configuration diagram of a system implementing memory circuitry based on the disclosed technology.

FIG. 10 is an example of configuration diagram of a system implementing memory circuitry based on the disclosed technology.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include one or more variable resistance elements each exhibiting different resistance states for storing data, and each of the variable resistance elements includes: a Magnetic Tunnel Junction (MTJ) structure including a free layer having a changeable magnetization direction, a pinned layer having a fixed magnetization direction and a tunnel barrier layer interposed between the free layer and the pinned layer; a seed layer disposed under the MTJ structure to facilitate a growth of the pinned layer or the free layer; and an amorphous metallic carbon layer disposed under the seed layer. Through this, data storage characteristics and operating characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include one or more variable resistance elements each exhibiting different resistance states for storing data, and each of the variable resistance elements includes: a Magnetic Tunnel Junction (MTJ) structure including a free layer having a changeable magnetization direction, a pinned layer having a fixed magnetization direction and a tunnel barrier layer interposed between the free layer and the pinned layer; a seed layer disposed under the MTJ structure to facilitate a growth of the pinned layer or the free layer; and an amorphous metallic carbon layer disposed under the seed layer. Through this, data storage characteristics and operating characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 11:
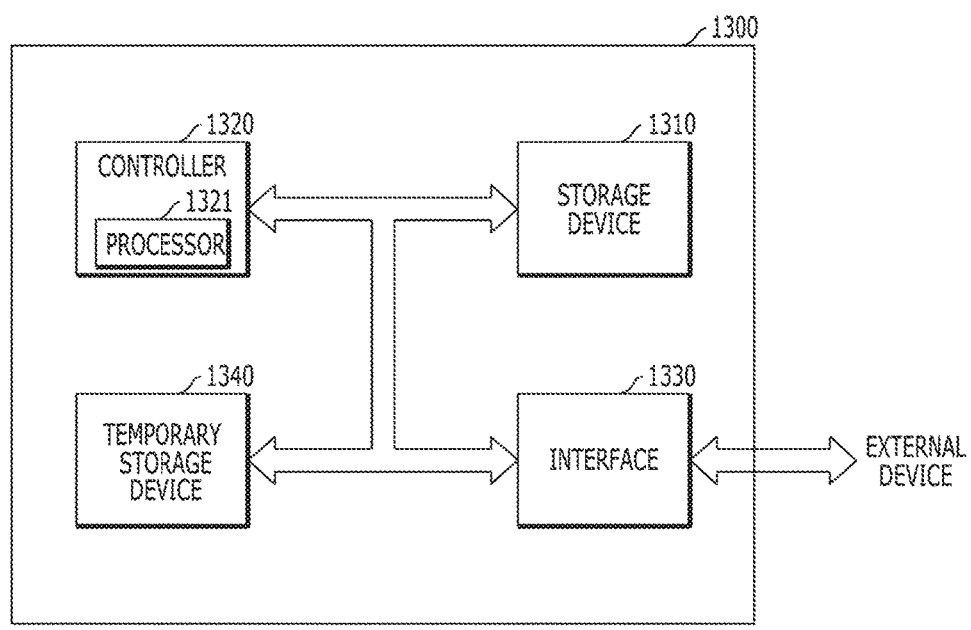
FIG. 11 is an example of configuration diagram of a data storage system implementing memory circuitry based on the disclosed technology.

FIG. 11 is an example of configuration diagram of a data storage system implementing memory circuitry based on the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include one or more variable resistance elements each exhibiting different resistance states for storing data, and each of the variable resistance elements includes: a Magnetic Tunnel Junction (MTJ) structure including a free layer having a changeable magnetization direction, a pinned layer having a fixed magnetization direction and a tunnel barrier layer interposed between the free layer and the pinned layer; a seed layer disposed under the MTJ structure to facilitate a growth of the pinned layer or the free layer; and an amorphous metallic carbon layer disposed under the seed layer. Through this, data storage characteristics and operating characteristics of the storage device 1310 or the temporary storage device 1340 may be improved. As a consequence, operating characteristics and data storage characteristics of the data storage system 1300 may be improved.

Figure 12:
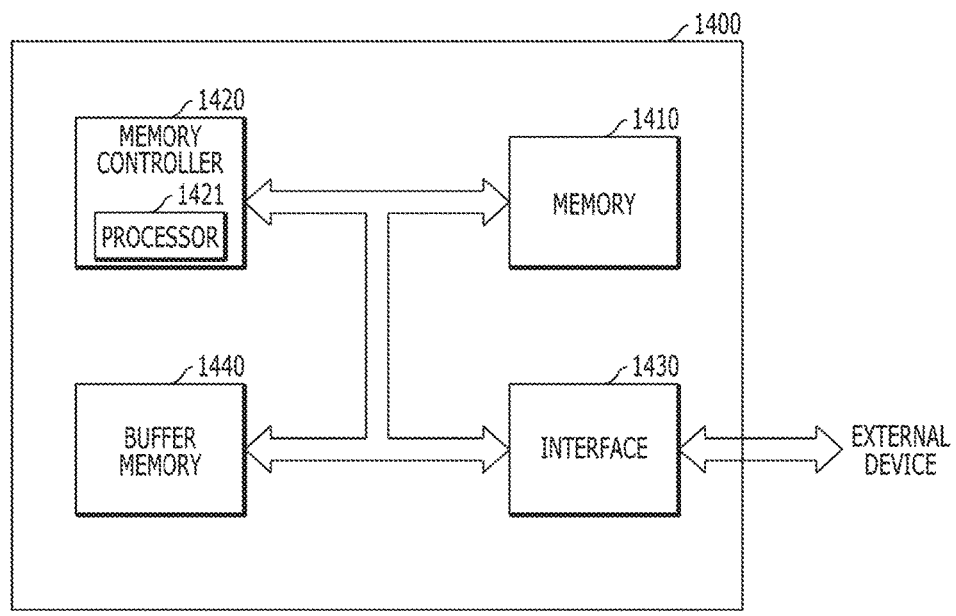
FIG. 12 is an example of configuration diagram of a memory system implementing memory circuitry based on the disclosed technology.

FIG. 12 is an example of configuration diagram of a memory system implementing memory circuitry based on the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include one or more variable resistance elements each exhibiting different resistance states for storing data, and each of the variable resistance elements includes: a Magnetic Tunnel Junction (MTJ) structure including a free layer having a changeable magnetization direction, a pinned layer having a fixed magnetization direction and a tunnel barrier layer interposed between the free layer and the pinned layer; a seed layer disposed under the MTJ structure to facilitate a growth of the pinned layer or the free layer; and an amorphous metallic carbon layer disposed under the seed layer. Through this, data storage characteristics and operating characteristics of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include one or more variable resistance elements each exhibiting different resistance states for storing data, and each of the variable resistance elements includes: a Magnetic Tunnel Junction (MTJ) structure including a free layer having a changeable magnetization direction, a pinned layer having a fixed magnetization direction and a tunnel barrier layer interposed between the free layer and the pinned layer; a seed layer disposed under the MTJ structure to facilitate a growth of the pinned layer or the free layer; and an amorphous metallic carbon layer disposed under the seed layer. Through this, data storage characteristics and operating characteristics of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory comprises one or more variable resistance elements each exhibiting different resistance states for storing data,
    wherein each variable resistance element comprises:
        a Magnetic Tunnel Junction (MTJ) structure including a free layer having a changeable magnetization direction, a pinned layer having a fixed magnetization direction and a tunnel barrier layer interposed between the free layer and the pinned layer;
        a seed layer disposed under the MTJ structure to facilitate a growth of the pinned layer or the free layer; and
        an amorphous layer including carbon and disposed under the seed layer, wherein the amorphous layer is electrically conductive and disposed in a lowermost portion of the variable resistance element.

2. The electronic device according to claim 1, wherein the semiconductor memory further comprises a first spacer disposed on at least a portion of sidewalls of the variable resistance element and containing carbon.

3. The electronic device according to claim 2, wherein the first spacer further comprises a metal or metal oxide with a smaller amount than the carbon.

4. The electronic device according to claim 2, wherein the semiconductor memory further comprises a second spacer disposed between the first spacer and the variable resistance element and including a metal or metal oxide.

5. The electronic device according to claim 4, wherein the semiconductor memory further comprises a third spacer disposed between the first spacer and the second spacer and including silicon oxide, silicon nitride or a combination thereof.

6. The electronic device according to claim 2, wherein the semiconductor memory further comprises a second spacer disposed over the first spacer and including a metal or metal oxide.

7. The electronic device according to claim 6, wherein the semiconductor memory further comprises a third spacer disposed between the first spacer and the second spacer and including silicon oxide, silicon nitride or a combination thereof.

8. The electronic device according to claim 1, wherein the amorphous layer comprises an upper portion having sidewalls which are aligned with the seed layer and the MTJ structure, and a lower portion having a width which is wider than that of the upper portion and having sidewalls which are not aligned with the upper portion.

9. The electronic device according to claim 1, wherein the variable resistance element further comprises a buffer layer interposed between the seed layer and the amorphous layer.

10. The electronic device according to claim 9, wherein the buffer layer comprises an upper portion having sidewalls which are aligned with the seed layer and the MTJ structure, and a lower portion having a width which is wider than that of the upper portion and having sidewalls which are not aligned with the upper portion, and
    the amorphous layer comprises an upper portion having sidewalls which are aligned with the lower portion of the buffer layer and a lower portion having a width which is wider than that of the upper portion of the amorphous layer and having sidewalls which are not aligned with the upper portion of the amorphous layer.

11. The electronic device of claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory is part of the memory unit in the microprocessor.

12. The electronic device of claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory is part of the cache memory unit in the processor.

13. The electronic device of claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

14. The electronic device of claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

15. The electronic device of claim 1, further comprising a memory system which includes:
a memory configured to store data and conserve stored data regardless of power supply;
a memory controller configured to control input and output of data to and from the memory according to a command inputted form an outside;
a buffer memory configured to buffer data exchanged between the memory and the outside; and
an interface configured to perform communication between at least one of the memory, the memory controller and the buffer memory and the outside,
wherein the semiconductor memory is part of the memory or the buffer memory in the memory system.

16. An electronic device comprising a semiconductor memory, wherein the semiconductor memory comprises one or more variable resistance elements each exhibiting different resistance states for storing data,
wherein each variable resistance element comprises:
a Magnetic Tunnel Junction (MTJ) structure including a free layer having a changeable magnetization direction, a pinned layer having a fixed magnetization direction and a tunnel barrier layer interposed between the free layer and the pinned layer;
a seed layer disposed under the MTJ structure to facilitate a growth of the pinned layer or the free layer;
an amorphous layer including carbon and disposed under the seed layer; and
a lower electrode disposed in a lowermost portion of the variable resistance element, and
wherein the amorphous layer is electrically conductive and disposed between the seed layer and the lower electrode.

17. The electronic device according to claim 16, wherein the lower electrode comprises an upper portion having sidewalls which are aligned with the amorphous layer, the seed layer and the MTJ structure, and a lower portion having a width which is wider than that of the upper portion and having sidewalls which are not aligned with the upper portion.

18. The electronic device according to claim 16, wherein the amorphous layer comprises an upper portion having sidewalls which are aligned with the seed layer and the MTJ structure, and a lower portion having a width which is wider than that of the upper portion and having sidewalls which are not aligned with the upper portion, and
the lower electrode comprises an upper portion having sidewalls which are aligned with the lower portion of the amorphous layer, and a lower portion having a width which is wider than that of the upper portion of the lower electrode and having sidewalls which are not aligned with the upper portion of the lower electrode.

19. The electronic device according to claim 16, wherein the semiconductor memory further comprises a spacer disposed on at least a portion of sidewalls of a remaining part of the variable resistance element other than the lower electrode,
wherein the spacer and the remaining part of the variable resistance element cover the lower electrode.

* * * * *